US009083336B2

(12) United States Patent
Fukami et al.

(10) Patent No.: US 9,083,336 B2
(45) Date of Patent: Jul. 14, 2015

(54) NON-VOLATILE LOGIC OPERATION DEVICE

(75) Inventors: Shunsuke Fukami, Tokyo (JP); Nobuyuki Ishiwata, Tokyo (JP)

(73) Assignee: NEC Corporation, Tokyo (JP)

(*) Notice: Subject to any disclaimer, the term of this patent is extended or adjusted under 35 U.S.C. 154(b) by 110 days.

(21) Appl. No.: 13/996,522

(22) PCT Filed: Jan. 5, 2012

(86) PCT No.: PCT/JP2012/050113
§ 371 (c)(1),
(2), (4) Date: Jun. 20, 2013

(87) PCT Pub. No.: WO2012/093701
PCT Pub. Date: Jul. 12, 2012

(65) Prior Publication Data
US 2013/0285700 A1 Oct. 31, 2013

(30) Foreign Application Priority Data
Jan. 6, 2011 (JP) ................................. 2011-001086

(51) Int. Cl.
*H01L 25/00* (2006.01)
*G11C 11/00* (2006.01)
*H03K 19/16* (2006.01)
(Continued)

(52) U.S. Cl.
CPC ............... *H03K 19/16* (2013.01); *H01L 43/08* (2013.01); *H03K 19/17724* (2013.01); *H03K 19/17728* (2013.01)

(58) Field of Classification Search
CPC .............. H03K 19/17736; H03K 19/17728; H03K 19/17704; H04L 23/525; H04L 23/5286; H04L 23/50; H04L 27/0207; H04L 27/0203; G06F 1/10

USPC ................ 326/37–41, 47, 101; 713/100–139; 327/564, 565
See application file for complete search history.

(56) References Cited

U.S. PATENT DOCUMENTS 5,825,203 A 10/1998 Kusunoki et al.
7,084,691 B2 8/2006 Hsu
(Continued)

FOREIGN PATENT DOCUMENTS

JP 9-148440 A 6/1997
JP 2006-32951 A 2/2006
(Continued)

OTHER PUBLICATIONS

Examiner is including machine translation of japanese text for listed foreign patent document WO 2010/087269.*
(Continued)

*Primary Examiner* — Dylan White
(74) *Attorney, Agent, or Firm* — McGinn IP Law Group, PLLC

(57) ABSTRACT

A non-volatile logic operation device includes an operation unit that is connected to a first input terminal, a second input terminal, and an output terminal, includes an operation layer, a first non-magnetic layer, and a reference layer, and outputs from the output terminal a result of a logic operation on signals applied at the first input terminal and the second input terminal, and a control unit that is connected to a third input terminal, and includes a control layer. The control unit is arranged in the vicinity of the operation unit.

20 Claims, 35 Drawing Sheets

(51) Int. Cl.
*H01L 43/08* (2006.01)
*H03K 19/177* (2006.01)

(56) References Cited

U.S. PATENT DOCUMENTS

| | | | |
|---|---|---|---|
| 7,439,770 B2 * | 10/2008 | Kim et al. | 326/52 |
| 7,825,686 B2 | 11/2010 | Hoeink et al. | |
| 8,120,950 B2 | 2/2012 | Kukami et al. | |
| 8,503,222 B2 * | 8/2013 | Suzuki et al. | 365/158 |
| 2006/0017488 A1 | 1/2006 | Hsu | |
| 2008/0013369 A1 * | 1/2008 | Kim et al. | 365/158 |
| 2010/0225350 A1 | 9/2010 | Hoeink et al. | |
| 2011/0002163 A1 | 1/2011 | Kukami et al. | |
| 2011/0148458 A1 * | 6/2011 | Sugibayashi et al. | 326/37 |
| 2011/0292718 A1 * | 12/2011 | Suzuki et al. | 365/158 |

FOREIGN PATENT DOCUMENTS

| | | | | |
|---|---|---|---|---|
| JP | 2007-228574 A | | 9/2007 | |
| JP | WO 2010/087269 | * | 8/2010 | H01L 43/08 |
| JP | 2010-534434 A | | 11/2010 | |
| WO | WO 2009/110532 A1 | | 9/2009 | |
| WO | WO 2010/024126 A1 | | 3/2010 | |
| WO | WO 2010/087269 A1 | | 8/2010 | |

OTHER PUBLICATIONS

International Search Report in PCT/JP2012/050113 dated Apr. 17, 2012 with English translation thereof.

* cited by examiner

FIG. 8A

| IN1 | IN2 | Hz | OUT1 |
|---|---|---|---|
| 0 | 0 | +z | 1 |
| 0 | 1 | | 0 |
| 1 | 0 | | 0 |
| 1 | 1 | | 0 |

FIG. 8B

| IN1 | IN2 | Hz | OUT1 |
|---|---|---|---|
| 0 | 0 | -z | 1 |
| 0 | 1 | | 1 |
| 1 | 0 | | 1 |
| 1 | 1 | | 0 |

NON-VOLATILE LOGIC OPERATION DEVICE

TECHNICAL FIELD

Reference to Related Application

The present application is based upon and claims the benefit of the priority of Japanese patent application No. JP2011-001086 filed on Jan. 6, 2011, the disclosure of which is incorporated herein in its entirety by reference thereto.

The present invention relates to a non-volatile logic operation device. More specifically, the invention relates to a non-volatile logic operation device using a magnetic material.

BACKGROUND

As a reconfigurable logic (Reconfigurable Logic), which is rewritable logic device, various devices have been proposed and put into practical use. A field programmable gate array (Field Programmable Gate Array: FPGA) where basic logic blocks are arranged on a semiconductor chip in an array to allow reconfiguration of logic, has been put into practical use, as an example of a reconfigurable logic.

As an example of the FPGA, Patent Literature 1 (JP Patent Kokai Publication No. JP-H09-148440A), for example, discloses a variable logic integrated circuit, in which a plurality of variable logic blocks each configured to enable a change of its logic function, and a plurality of variable wiring circuits each configured to enable interconnection between any of the variable logic blocks are alternately arranged on a semiconductor chip in transverse and vertical directions and a wiring arrangement that is not connected to the variable logic blocks but is to be used for a different purpose is formed above the variable logic blocks.

As another related art, Patent Literature 2 (JP Patent Kokai Publication No. JP2006-32951A), for example, discloses a single polarity-type resistance variable PCMO register adjusting circuit comprising a resistance bridge circuit network and a pulse feed-back circuit, wherein the resistance bridge circuit network includes a reference register and a matching register which is formed of a programmable resistance material having a single polarity-type resistance variable characteristic, wherein the resistance bridge circuit network compares resistance states of the reference register and the matching register and then generates a comparison signal indicating a difference between the resistance states, and wherein the pulse feed-back circuit is connected to the resistance bridge circuit network, supplies an electric pulse signal of a single polarity according to the comparison signal in order to correct the resistance value of the matching register with respect to the resistance value of the reference register, and reversibly adjusts the resistance value of the matching register with respect to the resistance value of the reference register.

[PTL 1]
JP Patent Kokai Publication No. JP-H-9-148440A
[PTL 2]
JP Patent Kokai Publication No. JP2006-32951A

SUMMARY

The following analysis will be given below.

In an FPGA such as the variable logic integrated circuit described in Patent Literature 1, configuration information of the FPGA is stored in an SRAM (Static Random Access Memory). Since the SRAM is a non-volatile memory, it is necessary to provide a non-volatile storage device (electrically programmable and erasable non-volatile memory) such as a flash memory together with the SRAM in order to retain the configuration information when a power thereof is turned off. For this reason, there is a problem that an area of the device (chip) will increase as much as an area of the flash memory to be provided together with the SRAM.

As a technique of solving the problem of an increase in the chip area due to the flash memory to be provided together with an SRAM, there may be conceived a technique of replacing an SRAM with a non-volatile memory such as an FeRAM (Ferroelectric Random Access Memory) or an MRAM (Magneto-resistive Random Access Memory).

However, in a case wherein an FeRAM, with which an SRAM is replaced, is used, there is a problem that the number of times of rewrite operations is limited. In a case wherein an MRAM, with which an SRAM is replaced, is used, there is a problem that a cell size is large. Therefore, this technique cannot solve the problem of an increase in a chip area.

As another technique of solving the problem of an increase in a chip area due to the flash memory to be provided together with the SRAM, it may be conceived to form a non-volatile logic operation circuit using a device that serves both as a logic device and a memory. If this technique could be realized, the device can be formed with a more compact size than with the above-mentioned technique of replacing an SRAM with the non-volatile memory.

The single polarity-type resistance variable PCMO register adjusting circuit in the above-mentioned Patent Literature 2, which is an example of this technique, is a reconfigurable non-volatile logic operation circuit using Spin MOSFET (Metal-Oxide Semiconductor Field-Effect Transistor) having a source/drain in which a ferromagnetic material is arranged. There is a problem, however, that it is difficult for the Spin MOSFET to perform a stable operation at room temperature due to a low efficiency of spin-torque transfer from a magnetic material to a semiconductor.

An object of the present invention is therefore to provide a non-volatile logic operation device which can operate at room temperature and in which a non-volatile logic operation circuit serving both as a logic device and a memory can be formed.

According to one of aspects of the present invention, there is provided a non-volatile logic operation device comprising:

an operation unit that is connected to a first input terminal, a second input terminal, and an output terminal, and that includes an operation layer; a first non-magnetic layer; and a reference layer, the operation unit outputting from the output terminal a result of a logic operation on signals applied at the first input terminal and the second input terminal; and a control unit that is connected to a third input terminal and that includes a control layer, the control unit being arranged in the vicinity of the operation unit. According to one exemplary embodiment, the control unit is arranged in a range where the control unit can exert a magnetic interaction on the operation unit.

According to the present invention, there can be provided a non-volatile logic operation device which can operate at room temperature and in which a non-volatile logic operation circuit serving both as a logic device and a memory can be formed.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 8A is a diagram illustrating a truth value table indicating operations in the exemplary embodiment of the present invention.

FIG. 8B is a diagram illustrating a truth value table indicating operations in the exemplary embodiment of the present invention.

MODES

Figure 1:
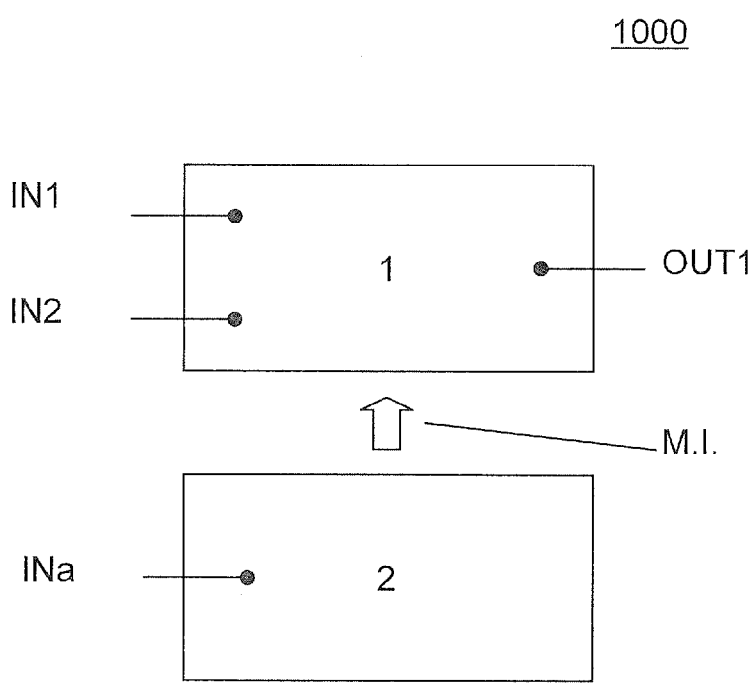
FIG. 1 is a diagram schematically showing basic components of a non-volatile logic operation device according to an exemplary embodiment of the present invention.

The following describes exemplary embodiments of the present invention. A non-volatile logic operation device in the exemplary embodiments, as a basic configuration, includes an operation unit that is connected to a first input terminal, a second input terminal, and an output terminal, includes an operation layer, a first non-magnetic layer, and a reference layer, and performs a logic operation on signals applied at the first input terminal and the second input terminal to output a result of the logic operation from the output terminal, and a control unit that is connected to a third input terminal and comprises a control layer. The control unit is arranged in the vicinity of the operation unit.

The operation layer in the exemplary embodiments includes a ferromagnetic material having perpendicular magnetic anisotropy.

The control unit in the exemplary embodiments exerts a magnetic interaction on the operation unit (the magnetic interaction being exerted from the vicinity of the operation unit). In the some exemplary embodiments, the magnetic interaction is a magnetostatic interaction. The control unit may be arranged spaced from the operation unit, and is arranged in a range where the control unit can exert the magnetic interaction on the operation unit, for example.

Further, in the exemplary embodiments, it may be so configured that the operation layer includes first to fourth magnetization fixed regions and a magnetization free region, the first magnetization fixed region is connected to the first input terminal, and the third magnetization fixed region is connected to the second input terminal (the operation layer is specified to utilize domain wall motion).

The operation layer in exemplary embodiments may be configured to have a planar shape including two three-forked portions.

The non-volatile logic operation device in exemplary embodiments may be configured to include a first magnetization fixed layer arranged in the vicinity of the operation layer.

Alternatively, the non-volatile logic operation device in the exemplary embodiments may be configured to include a third non-magnetic layer located adjacent to the operation layer and a third magnetization fixed layer located adjacent to the third non-magnetic layer and opposite to the operation layer (the operation layer is specified to utilize spin-torque transfer).

The non-volatile logic operation device in the exemplary embodiments may be configured to include a second non-magnetic layer located adjacent to the control layer and a second magnetization fixed layer located adjacent to the second non-magnetic layer and opposite to the control layer (the operation layer is designed to utilize spin-spin-torque transfer).

The control layer in the exemplary embodiments may be configured to include a ferromagnetic material having perpendicular magnetic anisotropy. Alternatively, the control layer may be configured to include a ferromagnetic material having in-plane magnetic anisotropy.

The control layer in the some exemplary embodiments may be configured to include a fifth magnetization free region, a sixth magnetization fixed region, and a second magnetization free region (the control layer is so designed to utilize domain wall motion).

In the exemplary embodiments, it may be so configured that a fourth magnetization fixed layer is arranged in the vicinity of the control layer.

The following describes exemplary embodiments with reference to accompanying drawings.

FIG. 1 is a diagram schematically illustrating basic configuration elements of a non-volatile logic operation device in an exemplary embodiment of the present invention. Referring to FIG. 1, this non-volatile logic operation device 1000 includes an operation unit 1 and a control unit 2. The operation unit 1 includes a first input terminal IN1, a second input terminal IN2, and an output terminal OUT1. The control unit 2 is configured to include a third input terminal INa and exert a magnetic interaction (magnetic interaction) M. I. on the operation unit 1.

The control unit 2 is arranged in the vicinity of the operation unit 1 so that the control unit 2 can exert the magnetic interaction M.1. on the operation unit 1. Preferably, a space (space) between the control unit 2 and the operation unit 1 is equal to or less than 100 nm. Specific modes of the magnetic interaction M.I. will be described later.

Figure 2A:
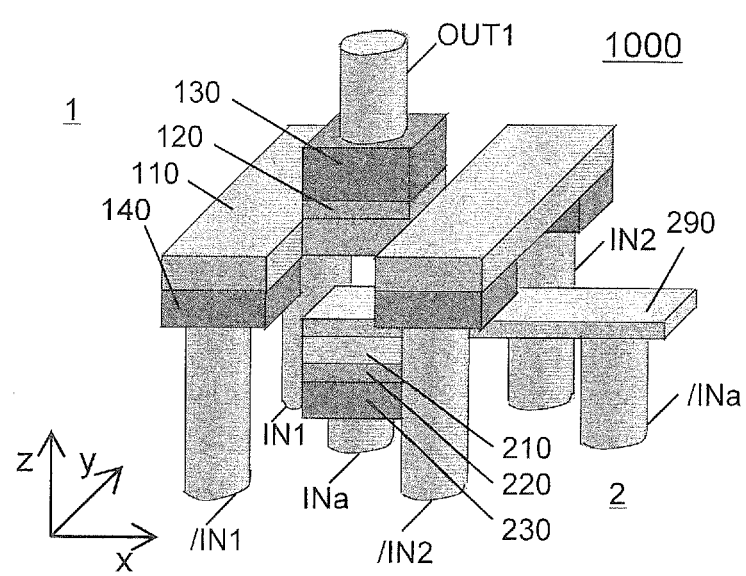
FIG. 2A is a perspective view schematically showing the non-volatile logic operation device in the exemplary embodiment of the present invention.
Figure 2B:
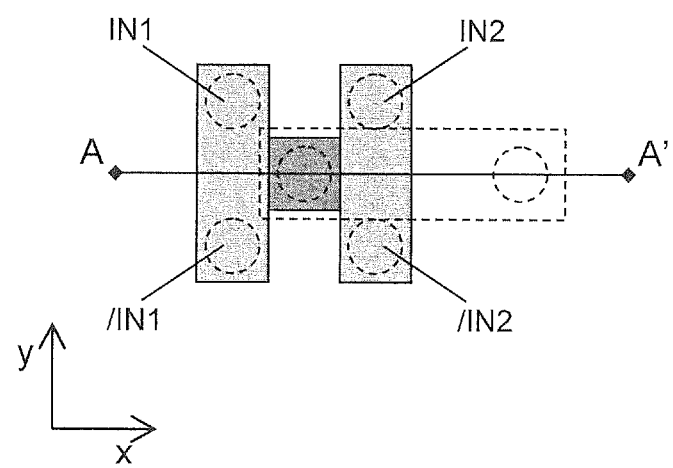
FIG. 2B is a plan view schematically illustrating the non-volatile logic operation device in the exemplary embodiment of the present invention.
Figure 2C:
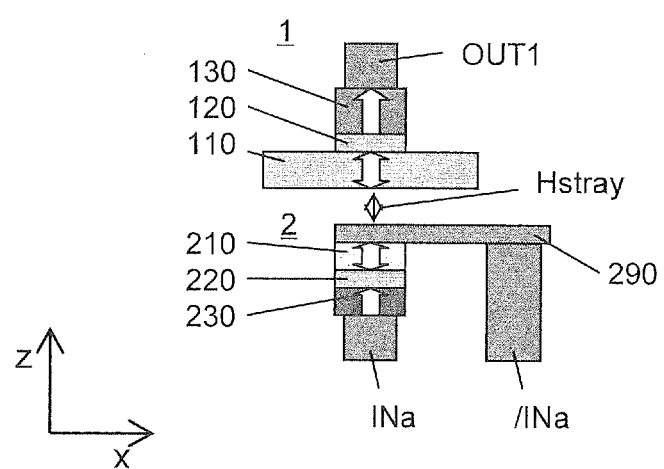
FIG. 2C is a sectional view schematically illustrating the non-volatile logic operation device in the exemplary embodiment of the present invention.

FIG. 2A is a perspective view schematically illustrating a configuration example of the non-volatile logic operation device 1000 in the exemplary embodiment in FIG. 1. FIG. 2B is a plan view schematically illustrating a configuration example of the non-volatile logic operation device 1000 in the exemplary embodiment in FIG. 1. FIG. 2C schematically illustrates a configuration of a section taken along a line A-A' in the plan view shown in FIG. 2B. It is assumed that, in an x-y-z coordinate system shown in FIGS. 2A to 2C, a z axis corresponds to a direction perpendicular to a substrate, while an x-y axis corresponds to a direction parallel with a plan surface of the substrate.

Referring to FIG. 2A, the operation unit 1 comprises an operation layer 110, a first non-magnetic layer 120, a reference layer 130, and a first magnetization fixed layers 140. The operation layer 110, the first non-magnetization layer 120, and the reference layer 130 form a laminated structure. The magnetization fixed layer 140 and the operation layer 110 form a laminated structure. Reference sign IN1 denotes a first input terminal, reference sign /IN1 denotes a complimentary first input terminal for receiving a signal that is complementary to a signal at the first input terminal, reference sign IN2 denotes a second input terminal, reference sign /IN2 denotes a complementary second input terminal for receiving a signal that is complementary to a signal at the second input terminal, and reference sign OUT1 denotes an output terminal.

The control unit 2 includes, as a laminated structure, a control layer 210, a second non-magnetic layer 220, and a second magnetization fixed layer 230 laminated in this stated order from a side close to the operation unit 1. A electrically conducting layer 290 is arranged on the control layer 210. Reference sign INa denotes a third input terminal, reference sign /INa denotes a complementary third input terminal for receiving a signal that is complementary to a signal at the third input terminal.

Each of the operation layer 110, the reference layer 130, the first magnetization fixed layer 140, the control layer 210, and the second magnetization fixed layer 230 is formed of a ferromagnetic material.

In the sectional view of FIG. 2C, possible direction of magnetization in these layers are each indicated by a white arrow.

Preferably, in the examples in FIGS. 2A to 2C, the operation layer 110 is formed of a ferromagnetic material having perpendicular magnetic anisotropy.

The operation layer 110 includes regions (magnetization fixed regions) whose magnetizations are fixed and a region (magnetization free region) whose magnetization is reversible. The structure of this operation layer 110 will be described later. The laminated structure of the first nonmagnetic layer 120 and the reference layer 130 is arranged on the magnetization free region of the operation layer 110, and the first magnetic fixed layer 140 is provided under each magnetization fixed region of the operation layer 110.

The first non-magnetic layer 120 is formed of a non-magnetic material (material that is not a ferromagnetic material, and is a paramagnetic material, or semi-magnetic material). Preferably, the first non-magnetic layer 120 is formed of an insulating material. The first nonmagnetic layer 120 is provided adjacent to the region of the operation layer 110 (magnetization free region: indicated by an upward and downward arrow (+ direction and − direction of the Z axis) in FIG. 2C) having the reversible magnetization.

The reference layer 130 is formed of the ferromagnetic material. Preferably, the reference layer 130 is formed of a ferromagnetic material having perpendicular magnetic anisotropy. The magnetization direction of the reference layer 130 is fixed (as indicated by an upward arrow in FIG. 2C). The reference layer 130 is provided adjacent to the first non-magnetic layer 120 and opposite to the operation layer 110.

In a case wherein the first non-magnetic layer 120 is formed of the non-magnetic material, a magnetic Tunnel Junction (Magnetic Tunnel Junction: MTJ) is formed by the operation layer 110, the first non-magnetic layer 120, and the reference layer 130.

Though the reference layer 130 is illustrated in FIGS. 2A and 2B as a single-layer ferromagnetic material just for simplification, it is preferable that the reference layer 130 be formed of a laminated film constituted from a plurality of ferromagnetic materials. Specifically, the reference layer 130 is laminated especially in the order of a ferromagnetic material, a non-magnetic material, and a ferromagnetic material as the laminated film, and has anti-parallel coupling (synthetic anti-ferromagnetic coupling) where magnetization directions of the ferromagnetic materials of the two layers are arranged opposite to each other. As the non-magnetic material which constitutes an intermediate layer between the ferromagnetic materials and exhibits the synthetic antiferromagnetic coupling, a transition metal Ru, Rh, or the like, for example, is known.

The first magnetization fixed layer 140 is also formed of the ferromagnetic material. The first magnetization fixed layer 140, is not, however, essential (does not need to be provided). The first magnetization fixed layer 140 is arranged adjacent to the region (magnetization fixed region) where the magnetization direction of the operation layer 110 is fixed. The first magnetization fixed layer 140 includes a function of fixing the magnetization direction of this magnetization fixed region to a predetermined direction.

The control layer 210 is formed of the ferromagnetic material. Referring to FIGS. 2A to 2C, preferably, the control layer 210 is formed of a ferromagnetic material having perpendicular magnetic anisotropy. The control layer 210 is arranged in the vicinity of the operation layer 110.

The control unit 2 in the non-volatile logic operation device 1000 is arranged to exert the magnetic interaction M. I. on the operation unit 1. The magnetic interaction M. I. is brought about by magnetization of the control layer 210. A leakage magnetic field Hstray from the control layer 210 in FIG. 2C corresponds to this magnetic interaction M. I. That is, the control unit 2 is so configured that the leakage magnetic field Hstray from the control layer 210 exerts influence on the operation layer 110.

The second non-magnetic layer 220 is formed of a non-magnetic material. The second non-magnetic layer 220 may be formed of an insulating material or a metal. The second non-magnetic layer 220 is provided adjacent to the control layer 210.

The second magnetization fixed layer 230 is formed of the ferromagnetic material. In the examples in FIGS. 2A and 2C, preferably, the second magnetization fixed layer 230 is formed of a ferromagnetic material having perpendicular magnetic anisotropy. The second magnetization fixed layer 230 is provided adjacent to the second non-magnetic layer 220 and opposite to the control layer 210.

Referring to FIGS. 2A to 2C, the first input terminal IN1 and the second input terminal IN2 are connected to the operation layer 110, the output terminal OUT1 is connected to the reference layer 130, and the third input terminal INa is connected to the second magnetization fixed layer 230.

The control layer 210 is connected to an external wiring (not shown) through the electrically conducting layer 290.

The operation layer 110 in FIGS. 2A to 2C is connected to the complementary first input terminal /IN1 and the complementary second input terminal /IN2 as well as the first input terminal IN1 and the second input terminal IN2.

The electrically conducting layer 290 is connected to the complementary third input terminal /INa.

Preferably, an electrode layer is provided between each layer described above and each terminal for contact with the external wiring, through the electrode layer is not shown in the exemplary embodiment in FIGS. 2A to 2C. The electrode layer in this case is formed of an electric conductor.

Figure 3A:
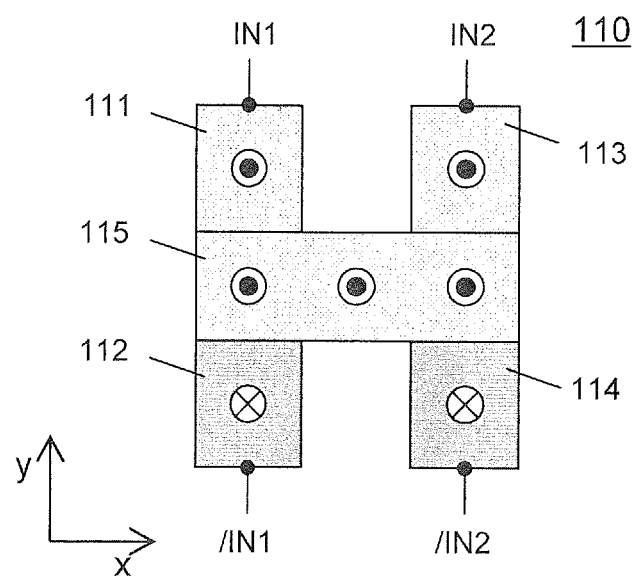
FIG. 3A is a plan view explaining a configuration of an operation layer in the exemplary embodiment of the present invention.
Figure 3B:
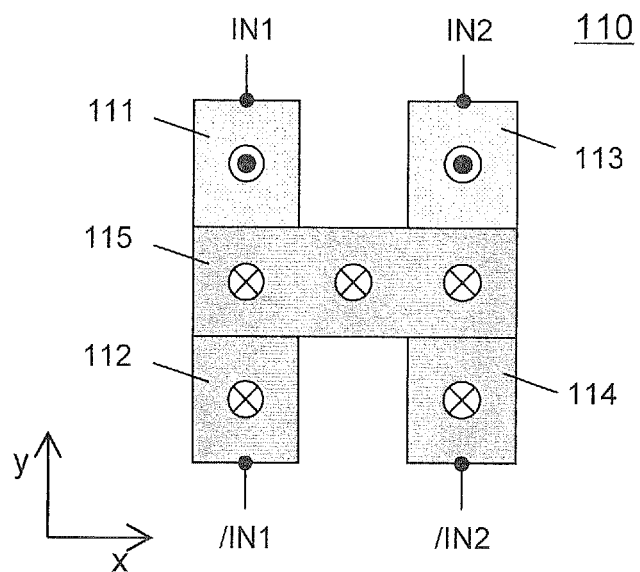
FIG. 3B is a plan view explaining the configuration of the operation layer in the exemplary embodiment of the present invention.

FIGS. 3A and 3B are plan views each illustrating a configuration of the operation layer 110 illustrated in FIGS. 2A to 2C. The configuration of the operation layer 110 will be described in detail with reference to FIGS. 3A and 3B. It is assumed that the operation layer 110 in FIGS. 3A and 3B is formed of the ferromagnetic material having perpendicular magnetic anisotropy. The operation layer 110 includes a first magnetization fixed region 111, a second magnetization fixed region 112, a third magnetization fixed region 113, a fourth magnetization fixed region 114, and a magnetization free region 115.

Magnetization directions of the first to fourth magnetization fixed regions 111 to 114 are fixed, and a magnetization direction of the magnetization free region 115 is reversible.

Magnetizations of the first magnetization fixed region 111 and the second magnetization fixed region 112 are fixed in mutually anti-parallel directions. The magnetization of the first magnetization fixed region 111 is fixed in the +z direction (from a back side to a front side of each of FIGS. 3A and 3B), and the magnetization of the second magnetization fixed region 112 is fixed in the −z direction (from the front side to the back side of each of FIGS. 3A and 3B). Magnetizations of the third magnetization fixed region 113 and the fourth magnetization fixed region 114 are fixed in mutually anti-parallel directions. The magnetization of the third magnetization fixed region 113 is fixed in the +z direction, and the magnetization of the fourth magnetization fixed region 114 is fixed in the −z direction.

The magnetization free region 115 may have a magnetization direction in any one of the +z direction and the −z direction. All of the first magnetization fixed region 111, the second magnetization fixed region 112, the third magnetization fixed region 113, and the fourth magnetization fixed region 114 are in contact with the magnetization free region 115. For that reason, the operation layer 110 has a planar surface shape including two three-forked portions to have a shape of an alphabet H.

The operation layer 110 may assume two states according to the magnetization direction of the magnetization free region 115. FIGS. 3A and 3B show the respective two states. That is, the magnetization direction of the magnetization free region 115 in FIG. 3A is the +z direction (extending upward from FIG. 3A), and the magnetization direction of the magnetization free region 115 in FIG. 3B is the −z direction (extending downward from FIG. 3B). Though no particular limitation is imposed, the two magnetization states in FIGS. 3A and 3B are respectively defined to be a "0" state and a "1" state of the non-volatile logic operation device. Referring to FIGS. 3A and 3B, the first magnetization fixed region 111, the second magnetization fixed region 112, the third magnetization fixed region 113, and the fourth magnetization fixed region 114 are respectively connected to the first input terminal IN1, the complementary first input terminal /IN1, the second input terminal IN2, and the complementary second input terminal /IN2, as described above.

Next, an operation method of the non-volatile logic operation device 1000 will be described.

Though not limited thereto, it is assumed that the non-volatile logic operation device 1000 performs a NAND (non-conjunction) operation or a NOR (non-disjunction) operation on two input signals.

Input signals are supplied to the operation layer 110 through the first input terminal IN1, the first input terminal /IN1 that is complementary to the first input terminal IN1, the second input terminal IN2, and the second input terminal /IN2 that is complementary to the second input terminal IN2. It is determined according to the state of the control layer 210 whether to perform the NAND operation or the NOR operation. When the respective input signals are input, the magnetization state of the operation layer 110 converges to one of the states shown in FIGS. 3A and 3B. The magnetization state of the operation layer 110 is converted to an output signal as a resistance difference in the laminated structure formed of the operation layer 110, the first non-magnetic layer 120, and the reference layer 130.

The following describes an operation of the operation layer 110. The input signals are supplied to the operation layer 110 through the first input terminal IN1, the complementary first input terminal /IN1, the second input terminal IN2, and the complementary second input terminal /IN2. The signals that are complementary to each other are supplied to the first input terminals IN1 and the complementary first input terminal /IN1, and the signals that are complementary to each other are supplied to the second input terminals IN2 and the complementary second input terminal /IN2. That is, when "0" is input to the first input terminal IN1, "1" is input to the complementary first input terminal /IN1. When "1" is input to the first input terminal IN1, "0" is input to the complementary first input terminal /IN1. Similar operations apply to the second input terminal IN2, as well.

FIGS. 4A, 4B, 4C, and 4D, and FIGS. 5A, 5B, 5C, and 5D schematically and respectively show magnetization states when a given period elapses after signals (0, 0), (0,1), (1,0) and (1,1) have been supplied to the first input terminal IN1 and the second input terminal IN2. In response to the above-mentioned input signals to be supplied to the first input terminal IN1 and the second input terminal IN2, signals, (/IN1,/IN2)=(1, 1), (1, 0), (0,1), and (0, 0) are respectively supplied to the complementary first input terminal /IN1 and the complementary second input terminal /IN2.

Figure 4A:
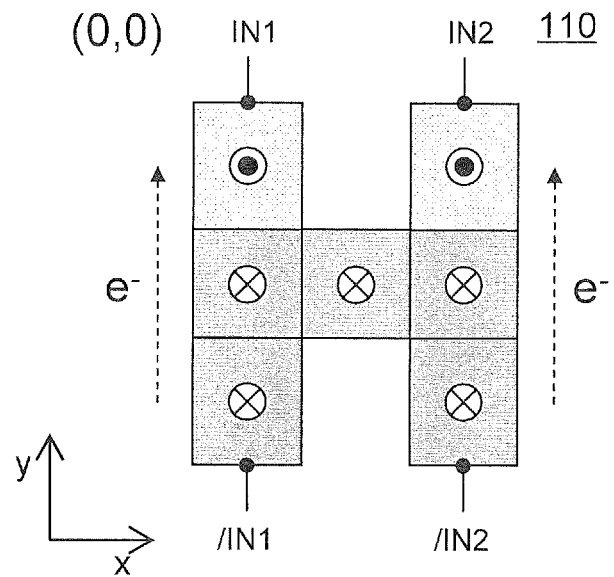
FIG. 4A is a diagram explaining an operation of the operation layer in the exemplary embodiment of the present invention (when signals (0, 0) are supplied in an initial state of "0").
Figure 4B:
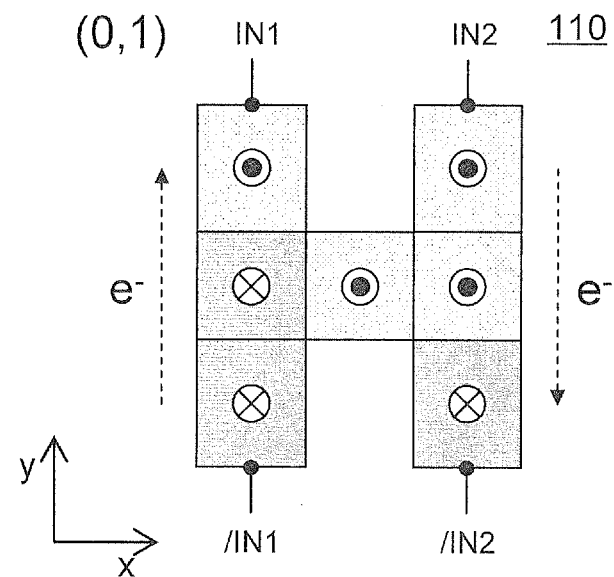
FIG. 4B is a diagram explaining an operation of the operation layer in the exemplary embodiment of the present invention (when signals (0, 1) are supplied in the initial state of "0").
Figure 4C:
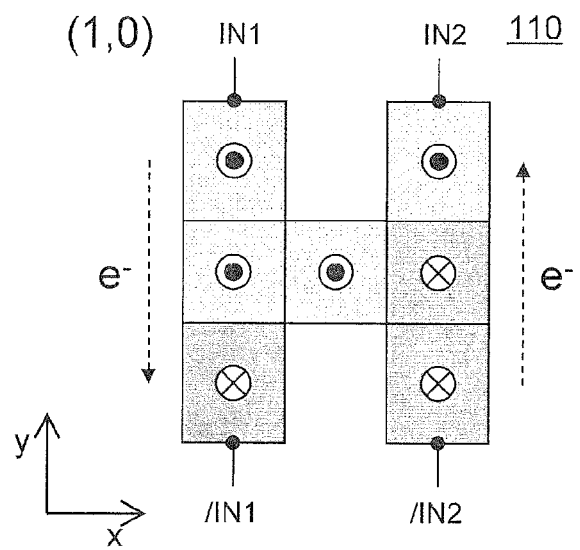
FIG. 4C is a diagram explaining an operation of the operation layer in the exemplary embodiment of the present invention (when signals (1, 0) are supplied in the initial state of "0").
Figure 4D:
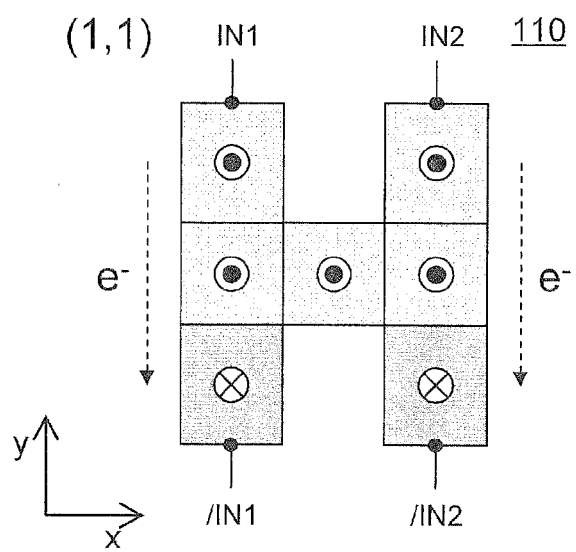
FIG. 4D is a diagram explaining an operation of the operation layer in the exemplary embodiment of the present invention (when signals (1, 1) are supplied in the initial state of "0").
Figure 5A:
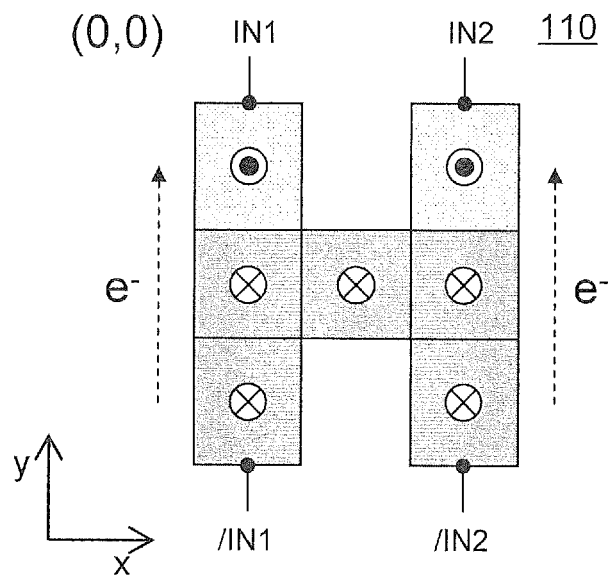
FIG. 5A is a diagram explaining an operation of the operation layer in the exemplary embodiment of the present invention (when signals (0, 0) are supplied in an initial state of "1").
Figure 5B:
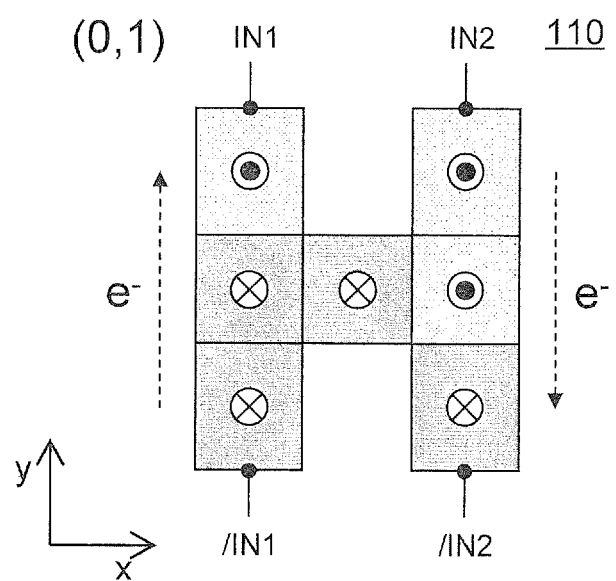
FIG. 5B is a diagram explaining an operation of the operation layer in the exemplary embodiment of the present invention (when signals (0, 1) are supplied in the initial state of "1").

FIGS. 4A to 4B show a case where the initial state of the operation layer 110 is the "0" state in FIG. 3A, while FIGS. 5A to 5B show a case where the initial state of the operation layer 110 is the "1" state in FIG. 3B. In FIGS. 4A to 4D and FIGS. 5A to 5D, flow directions of electrons e⁻ are shown by broken-line arrows. Due to these electron flows, current-induced domain wall motion occurs within the operation layer 110. That is, a domain wall moves in an electron flow direction. The moving speed of the domain wall during the current-induced domain wall motion is approximately 50 m/s. Accordingly, when the typical size of the device is set to 50 nm (nanometers), the motion of the domain wall ends on a time scale of 1 nano (nano) second, and the magnetization free region 115 converges to a certain magnetic domain state.

Specifically, the magnetization free region 115 converges to one of the following four types of magnetic domain states.

(1) When the signals (0, 0) are respectively supplied to the first input terminal IN1 and the second input terminal IN2 as shown in FIGS. 4A and 5A, the magnetization of the entre magnetization free region 115 is made oriented in the −z direction.

(2) When the signals (0, 1) are respectively supplied to the first input terminal IN1 and the second input terminal IN2 as shown in FIGS. 4B and 5B, a region magnetized in the +z direction and a region magnetized in the −z direction are formed within the magnetization free region 115.

Figure 5C:
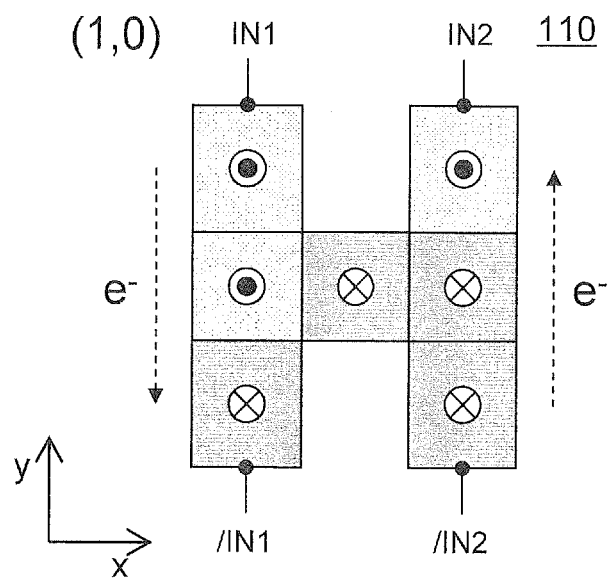
FIG. 5C is a diagram explaining an operation of the operation layer in the exemplary embodiment of the present invention (when signals (1, 0) are supplied in the initial state of "1").

(3) When the signals (1, 0) are respectively supplied to the first input terminal IN1 and the second input terminal IN2 as shown in FIGS. 4C and 5C, a region magnetized in the +z direction and a region magnetized in the −z direction are formed within the magnetization free region 115.

Figure 5D:
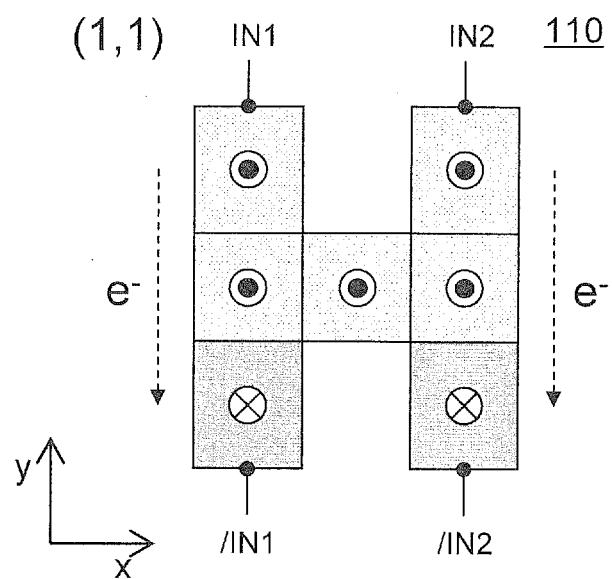
FIG. 5D is a diagram explaining an operation of the operation layer in the exemplary embodiment of the present invention (when signals (1, 1) are supplied in the initial state of "1").

(4) When the signals (1, 1) are respectively supplied to the first input terminal IN1 and the second input terminal IN2 as shown in FIGS. 4D and 5D, the magnetization of the entire magnetization free region 115 is made oriented in the +z direction.

FIGS. 6A to 6D and FIGS. 7A to 7D illustrate magnetic domain states which are finally achieved from the magnetic domain states of these four types when the magnetic domain states of these four types have relaxed with an external magnetic field is being applied. Each of FIGS. 6A to 6D shows a state where the magnetic field has been applied in the +z direction, while each of FIGS. 7A to 7D shows a state where the magnetic field has been applied in the −z direction.

Figure 6A:
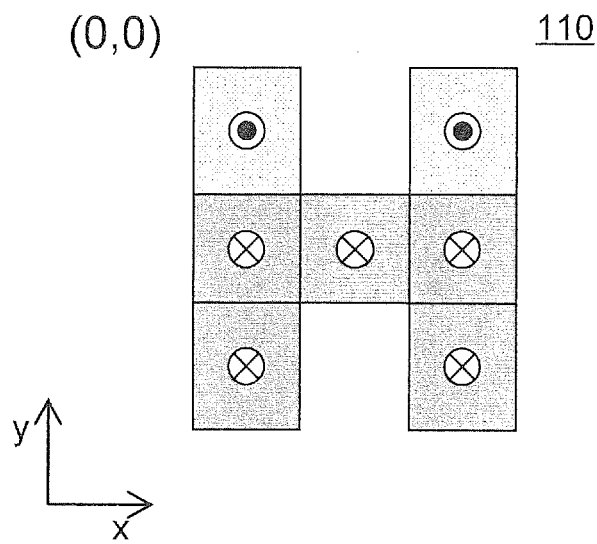
FIG. 6A is a diagram explaining an operation of the operation layer in the exemplary embodiment of the present invention (after relaxation with a magnetic field in a +z direction applied to the operation layer).

As to the magnetic domain state shown in each of FIGS. 4A and 5A, in a case wherein an input electric current is cut off with an appropriate degree of the magnetic field in the +z direction being applied, the magnetization of the magnetization free region 115 remains in the state oriented in the −z direction, as shown in FIG. 6A, and is not changed. This is because, originally, only the magnetic domain magnetized in the −z direction is present in the magnetization free region 115. Accordingly, the "1" state shown in FIG. 3B is achieved.

Figure 6B:
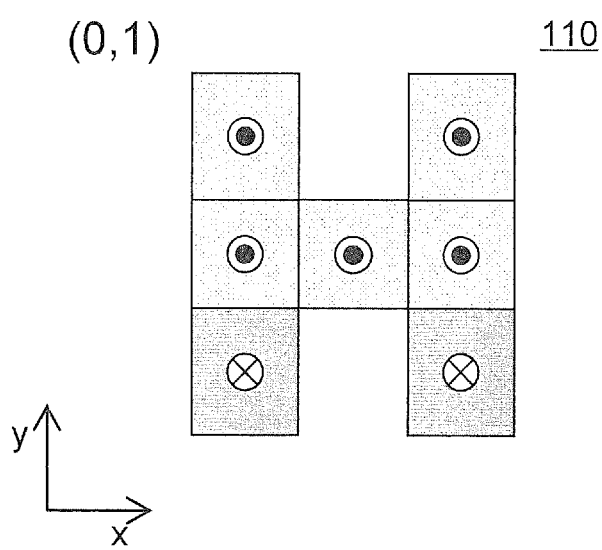
FIG. 6B is a diagram explaining an operation of the operation layer in the exemplary embodiment of the present invention (after relaxation with the magnetic field in the +z direction applied to the operation layer).

As to the magnetic domain state shown in each of FIGS. 4B and 5B, in a case wherein an input electric current is cut off with an appropriate degree of the magnetic field in the +z direction being applied, the state is achieved in which the magnetization of the magnetization free region 115 is oriented in the + direction, as shown in FIG. 6B. This is because, the magnetic domain magnetized in the +z direction and the magnetic domain magnetized in the −z direction are present in the magnetization free region 115 originally, and a domain wall moves to the boundary between the magnetic domains magnetized in the +z direction and −z direction due to the magnetic field in the +z direction. Accordingly, the "0" state shown in FIG. 3A is achieved.

Figure 6C:
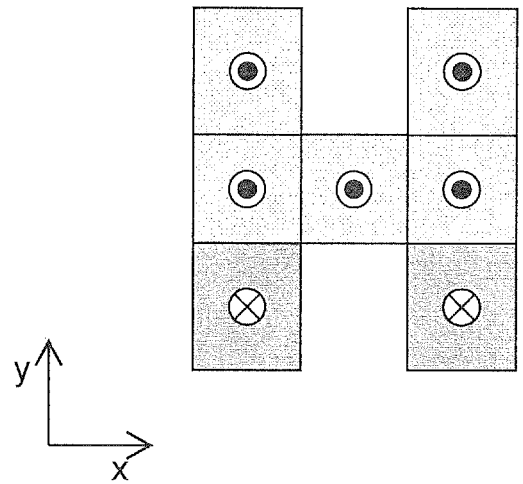
FIG. 6C is a diagram explaining an operation of the operation layer in the exemplary embodiment of the present invention (after relaxation with the magnetic field in the +z direction applied to the operation layer).

As to the magnetic domain state shown in each of FIGS. 4C and 5C, in a case wherein an input electric currents is cut off with an appropriate degree of the magnetic field in the +z direction being applied, the state is achieved in which the magnetization of the magnetization free region 115 is oriented in the + direction, as shown in FIG. 6C. This is because, the magnetic domain magnetized in the +z direction and the magnetic domain magnetized in the −z direction are present in the magnetization free region 115 originally, and a domain wall moves to the boundary between the magnetic domains magnetized in the +z direction and −z direction due to the magnetic field in the +z direction. Accordingly, the "0" state shown in FIG. 3A is achieved.

Figure 6D:
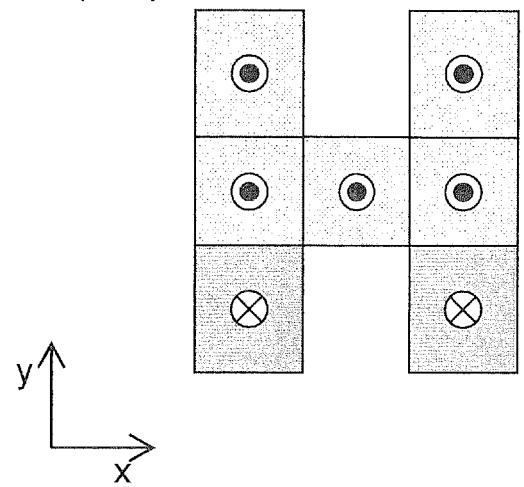
FIG. 6D is a diagram explaining an operation of the operation layer in the exemplary embodiment of the present invention (after relaxation with the magnetic field in the +z direction applied to the operation layer).

As to the magnetic domain state shown in each of FIGS. 4D and 5D, in a case wherein an input electric current is cut off with an appropriate degree of the magnetic field in the +z direction being applied, magnetization of the magnetization free region 115 remains in the state turned in the +z direction, as shown in FIG. 6D, and is not changed. This is because, originally, only the magnetic domain magnetized in the +z direction is present in the magnetization free region 115. Accordingly, the "0" state shown in FIG. 3A is achieved.

Figure 7A:
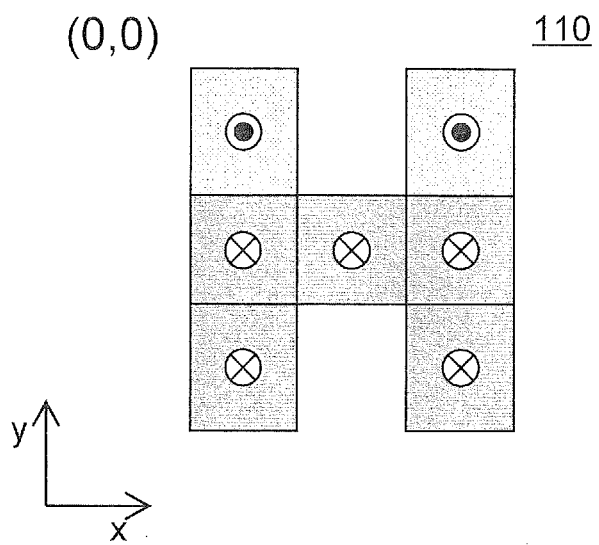
FIG. 7A is a diagram explaining an operation of the operation layer in the exemplary embodiment of the present invention (after relaxation with a magnetic field in a −z direction applied to the operation layer).

From the magnetic domain state shown in each of FIGS. 4A and 5A, in a case wherein an input electric current is cut off with an appropriate degree of the magnetic field in the −z direction being applied, the "1" state in FIG. 3B is achieved, as shown in FIG. 7A, based on the same principle described above.

Figure 7B:
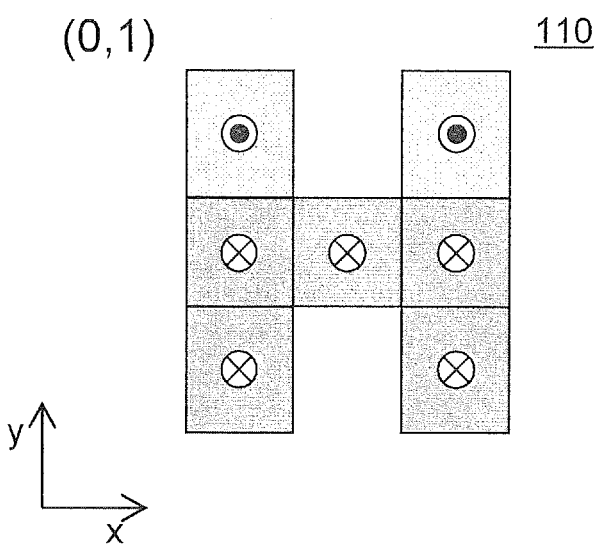
FIG. 7B is a diagram explaining an operation of the operation layer in the exemplary embodiment of the present invention (after relaxation with the magnetic field in the −z direction applied to the operation layer).

From the magnetic domain state shown in each of FIGS. 4B and 5B, in a case wherein an input electric current is cut off with an appropriate degree of the magnetic field in the −z direction being applied, the "1" state in FIG. 3B is achieved, as shown in FIG. 7B.

Figure 7C:
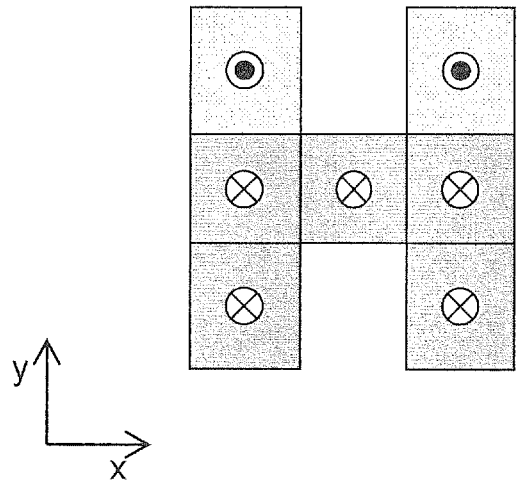
FIG. 7C is a diagram explaining an operation of the operation layer in the exemplary embodiment of the present invention (after relaxation with the magnetic field in the −z direction applied to the operation layer).

From the magnetic domain state shown in each of FIGS. 4C and 5C, in a case wherein an input electric current is cut off with an appropriate degree of the magnetic field in the −z direction being applied, the "1" state in FIG. 3B is achieved, as shown in FIG. 7C.

Figure 7D:
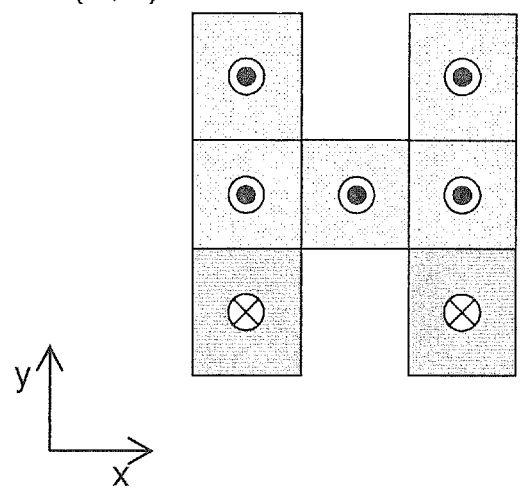
FIG. 7D is a diagram explaining an operation of the operation layer in the exemplary embodiment of the present invention (after relaxation with the magnetic field in the −z direction applied to the operation layer).

From the magnetic domain state shown in each of FIGS. 4D and 5D, in a case wherein an input electric current is cut off with an appropriate degree of the magnetic field in the −z direction being applied, the "0" state in FIG. 3A is achieved, as shown in FIG. 7D.

FIGS. 8A and 8B are truth value tables illustrating the changes in the magnetic domains in the exemplary embodiment shown in FIGS. 6A to 6D, and in the exemplary embodiment shown in FIGS. 7A to 7D. FIG. 8A shows the final magnetic domain states (in FIGS. 6A to 6D) for the signals supplied to the first input terminal IN1 and the second input terminal IN2 with the appropriate degree of the external field in the +z direction being applied. FIG. 8B shows the final magnetic domain states (in FIGS. 7A to 7D) for the signals supplied to the first input terminal IN1 and the second input terminal IN2 with the appropriate degree of the external field in the −z direction being applied. It can be seen that FIG. 8A corresponds to the NOR operation, while FIG. 8B corresponds to the NAND operation.

Preferably, the magnitude of the magnetic field in the z direction, when relaxing each magnetic domain state, is set as follows, for example:

In a case wherein the magnetic fields in both of the +z direction and the −z direction are present in the magnetization free region 115, the magnetic field, which is equal to or larger than a magnetic field (domain wall motion magnetic field) where the domain wall motion occurs, is necessary. On the other hand, in a case where only the magnetic domain in the −z (or +z) direction is present in the magnetization free region 115, the magnitude of the magnetic field in the +z (−z) direction needs to be equal to or less than a magnetic field (inversion nucleation magnetic field) that reverses the magnetization of the magnetic domain. Accordingly, the "appropriate degree of the magnetic field" is more specifically set to be equal to or larger than the domain wall motion magnetic field and equal to or less than the inversion nucleation magnetic field. Generally, the domain wall motion magnetic field has a magnitude of several ten to several hundred oersteds, and the inversion nucleation magnetic field has a magnitude of several hundred to several ten thousand oersteds.

Even in a case where the magnetic domain in the −z (+z) direction alone is present in the magnetization free region 115, a domain wall is present at each of the boundary between the first magnetization fixed region 111 (second magnetization fixed region 112) and the magnetization free region 115 and the boundary between the third magnetization fixed region 113 (fourth magnetization fixed region 114) and the magnetization free region 115. Accordingly, in order to prevent these domain walls from moving when a magnetic field in the +z (−z) direction is applied to these states, it is necessary to satisfy one of the following two requirements (I) and (II):

(I) The external magnetic field in ±z direction is sufficiently weak at a boundary between the first magnetization fixed region 111 (second magnetization fixed region 112) and the magnetization free region 115 and at a boundary between the third magnetization fixed region 113 (fourth magnetization fixed region 114) and the magnetization free region 115.

When the external magnetic field the ±z direction is sufficiently weak at the boundary between the first magnetization fixed region 111 (second magnetization fixed region 112) and the magnetization free region 115 and at the boundary between the third magnetization fixed region 113 (fourth magnetization fixed region 114) and the magnetization free region 115, the domain walls formed at the boundaries do not move due to the magnetic field.

(II) The domain walls are sufficiently strongly pinned at the boundary between the first magnetization fixed region 111 (second magnetization fixed region 112) and the magnetization free region 115 and at the boundary between the third magnetization fixed region 113 (fourth magnetization fixed region 114) and the magnetization free region 115.

When the pinning of the domain walls is strong, the domain wall motion does not occur even if the magnetic field in the ±z direction is being applied. A description will be given later about a method of forming the boundary between the first magnetization fixed region 111 (second magnetization fixed region 112) and the magnetization free region 115 and the boundary between the third magnetization fixed region 113 (fourth magnetization fixed region 114) and the magnetization free region 115 to be pin sites (pinning sites) of the domain walls.

During the process of the current-induced domain wall motion in the exemplary embodiment shown in each of FIGS. 4A to 4D and FIGS. 5A to 5D, the external magnetic field in the ±z direction may be applied. This is because it is experimentally confirmed that the current-induced domain wall motion can occur in a similar manner even during application of the magnetic field in the ±z direction.

Thus, the process where the current-induced domain wall motion in the exemplary embodiment shown in each of FIGS. 4A to 4D and FIGS. 5A to 5D occurs and the process where the magnetic domain is relaxed in the presence of the external magnetic field in each of FIGS. 6A to 6D and FIGS. 7A to 7D can be both performed under the same external magnetic field. That is, even in a state where the external field is constantly applied, the changes in the magnetic domain states from those in FIGS. 4A to 4D to those in FIGS. 7A to 7D are achieved.

Next, a change in a logic state of the non-volatile logic operation device will be described with reference to FIGS. 9A to 9B. Herein, the "logic state" corresponds to one of a state where the non-volatile logic operation device 1000 (in FIG. 1) performs the NOR operation and a state where the non-volatile logic operation device 1000 (in FIG. 1) performs the NAND operation. The logic state (for performing the NOR operation/NAND operation) of the non-volatile logic operation device 1000 is determined by a state (magnetization direction of the control layer 210) of the control unit 2. The magnetization direction of the control layer 210 can be changed by feeding a current between the third input terminal INa and the complementary third input terminal /INa.

Figure 9A:
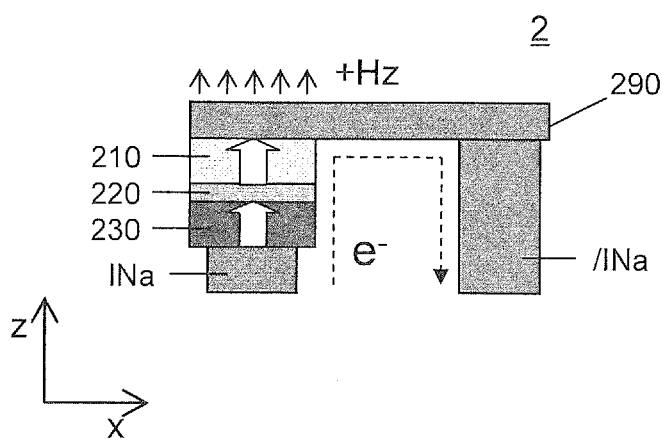
FIG. 9A is a diagram explaining an operation of (a control layer) in the exemplary embodiment of the present invention.
Figure 9B:
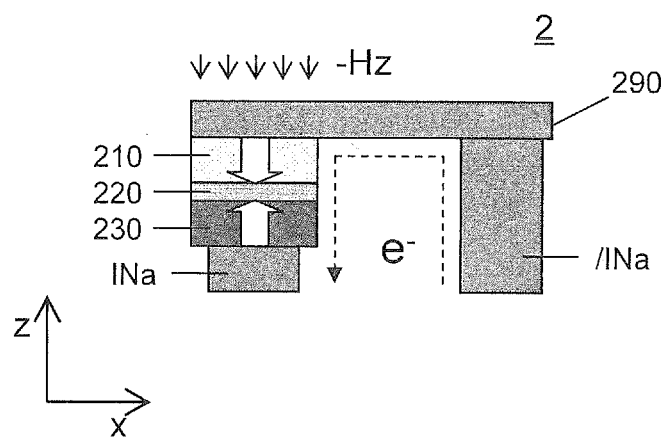
FIG. 9B is a diagram explaining an operation of (the control layer) in the exemplary embodiment of the present invention.

FIGS. 9A and 9B schematically and respectively show magnetization states where "0" and "1" are supplied to the third input terminal INa, in the sectional view of the control unit 2 in the exemplary embodiment shown in FIG. 2C.

In a case wherein "0" is supplied to the third input terminal INa as shown in FIG. 9A, the complementary third input terminal /INa assumes "1", and conduction electrons (e−) flow from the third input terminal INa to the complementary third input terminal /INa through the second magnetization fixed layer 230, the second non-magnetic layer 220, the control layer 210, and the electrically conducting layer 290 (wherein a direction of the current is opposite to the direction of the conduction electrons). In this case, a spin torque in the +z direction is supplied to the control layer 210 from the second magnetization fixed layer 230, so that the control layer 210 is magnetized in the +z direction.

Similarly, when "1" is supplied to the third input terminal INa as shown in FIG. 9B, the complementary third input terminal /INa assumes "0". Then, conduction electrons (e−) flow from the complementary third input terminal /INa to the third input terminal INa through the electrically conducting layer 290, the control layer 210, the second non-magnetic layer 220, and the second magnetization fixed layer 230 (wherein a direction of the current is opposite to the direction of the conduction electrons (e−)). In this case, a spin oriented in the −z direction is applied to the control layer 210 from the second magnetization fixed layer 230, so that the control layer 210 is magnetized in the −z direction.

In the state in FIG. 9A, a +z direction leakage magnetic field +Hz is formed on the control layer 210. Accordingly, when the operation layer 110 is arranged in the vicinity of this magnetic field, the NOR operation of the two signals applied at the first input terminal IN1 and the second input terminal IN2 is performed as shown in each of FIGS. 6A to 6D.

In the state in FIG. 9B, a −z direction leakage magnetic field +Hz is formed on the control layer 210. Accordingly, when the operation layer 110 is arranged in the vicinity of this magnetic field, the NAND operation of the two signals applied at the first input terminal IN1 and the second input terminal IN2 is performed as shown in each of FIGS. 7A to 7D.

Next, a method of outputting an operation result or reading by the non-volatile logic operation device 1000 will be described. The description will be given, assuming herein that the first non-magnetic layer 120 is formed of the insulating material and the operation layer 110, the first non-magnetic layer 120, and the reference layer 130 form the MTJ to exhibit a tunnel magneto-resistance effect.

Figure 10A:
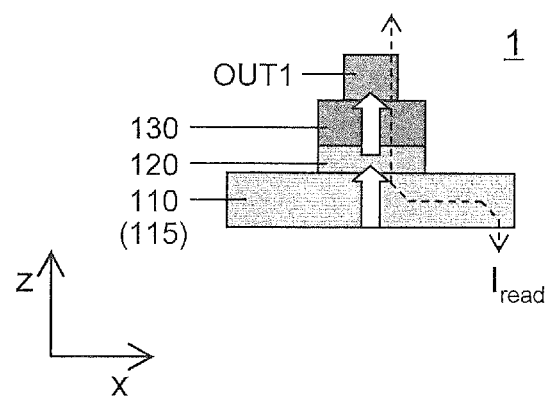
FIG. 10A is a diagram explaining an operation (read operation) in the exemplary embodiment of the present invention.
Figure 10B:
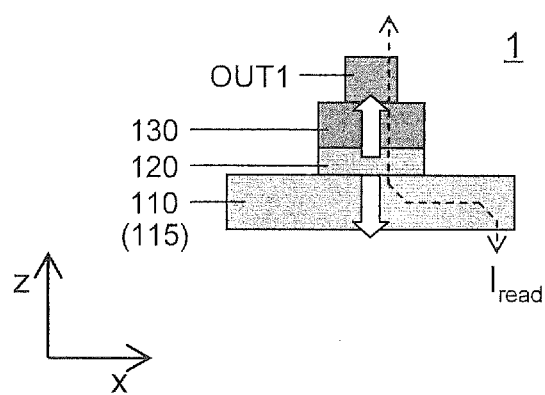
FIG. 10B is a diagram explaining an operation (read operation) in the exemplary embodiment of the present invention.

Each of FIGS. 10A and 10B schematically shows the magnetized state of the MTJ after the operation of the operation layer 110 has been finished in the configuration of the section of the operation unit 1 in the exemplary embodiment shown in FIG. 2C. The magnetization direction of the operation layer 110 is indicated by a white arrow, which represents the magnetization direction of the magnetization free region 115 of the operation layer 110.

In the state in FIG. 10A, the MTJ has a parallel magnetization arrangement (where magnetizations of the two ferromagnetic materials on both sides of the non-magnetic material are parallel). Accordingly, a low-resistance state is achieved. On the other hand, in the state in FIG. 10B, the MTJ has an anti-parallel magnetization arrangement (where magnetizations of the two ferromagnetic materials on the both sides of the non-magnetic material are anti-parallel). Accordingly, a high-resistance state is achieved. In this manner, the magnetization direction of the magnetization free region 115 is output as a resistance difference of the MTJ.

Figure 11:
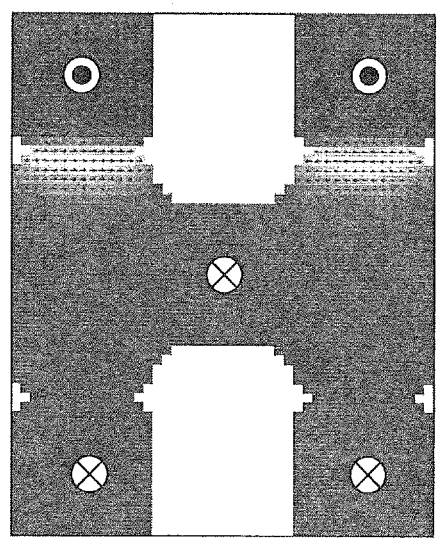
FIG. 11 is a diagram illustrating a simulation result (of the initial state) in the exemplary embodiment of the present invention.
Figure 12:
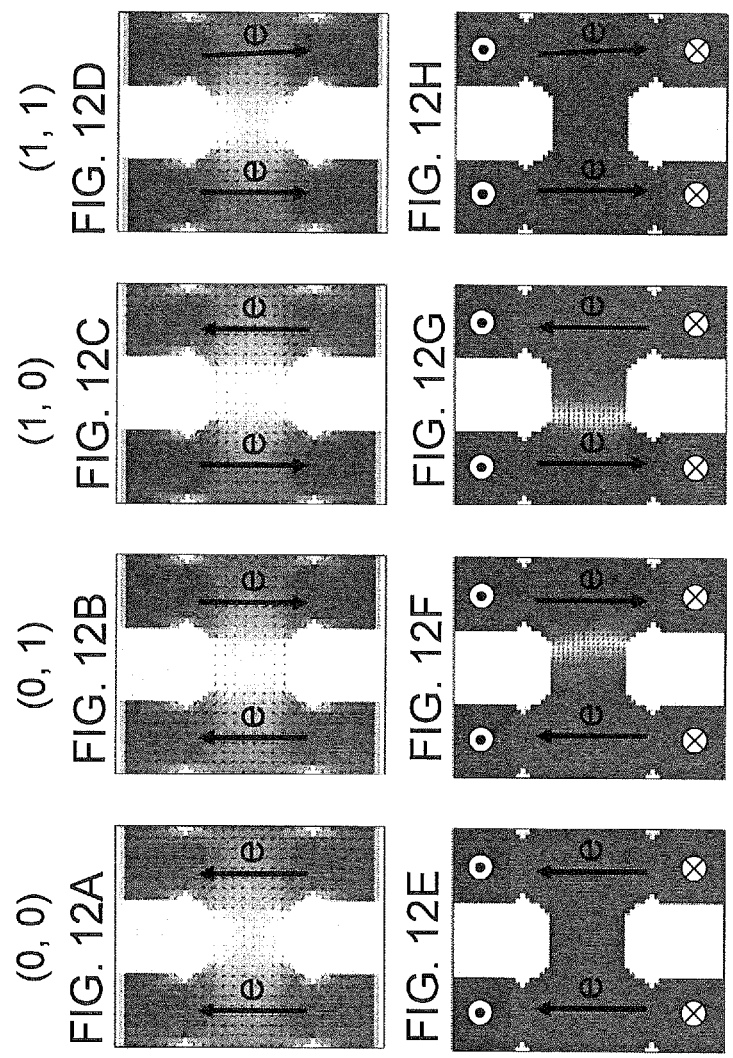
FIGS. 12A to 12H are diagrams each illustrating a simulation result (illustrating a current density and a magnetization state when currents are introduced) in the exemplary embodiment of the present invention.
Figure 13:
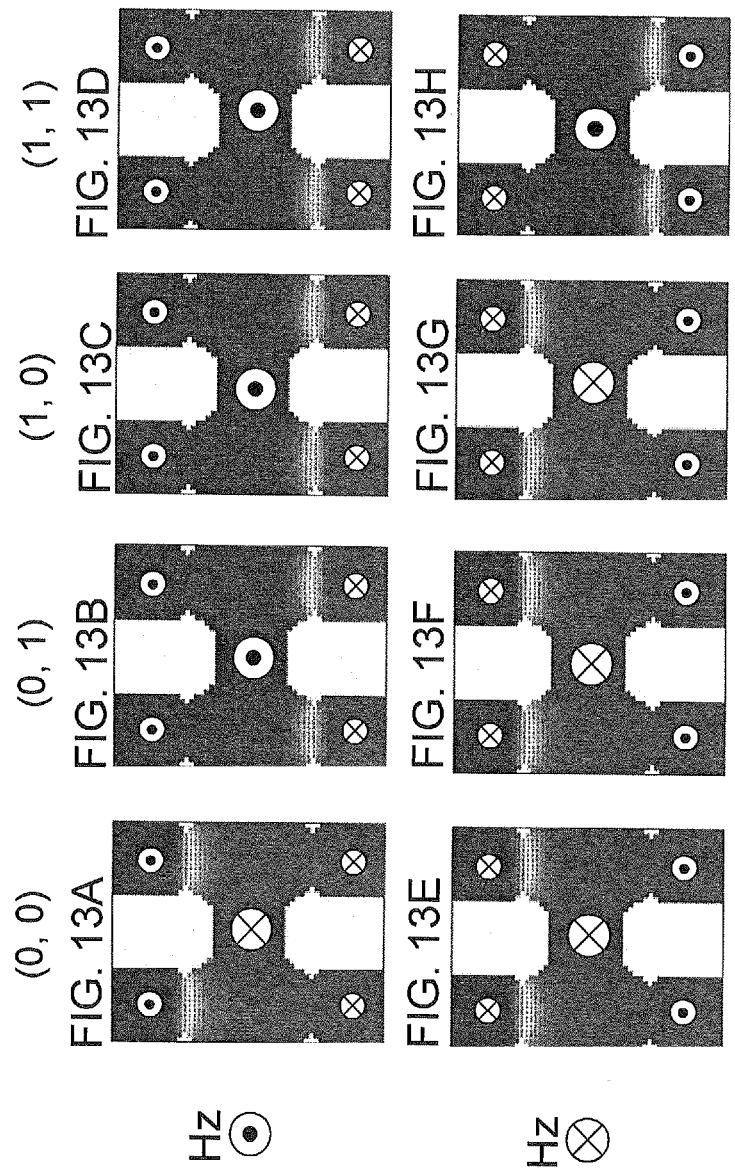
FIGS. 13A to 13H are diagrams each illustrating a simulation result (after the current is off) in the exemplary embodiment of the present invention.

Next, computation results by simulation of the above-mentioned operations will be described. In simulation computations, a pattern as shown in FIG. 11 and the initial state were used. The state in FIG. 11 corresponds to the "1" state shown in FIG. 3B.

FIGS. 12A, 12B, 12C, and 12D respectively show computation results of current density distributions when signals (0, 0), (0, 1), (1, 0) and (1, 1) are respectively supplied to the first input terminal IN1 and the second input terminal IN. Flows of electrons $e^-$ are indicated by white arrows.

FIGS. 12E, 12F, 12G, and 12H respectively show magnetization states, when currents with the current density distributions shown in FIGS. 12A, 12B, 12C, and 12D are fed in. In the simulation computations, a current density in the order of $1 \times 10^8$ (A/cm$^2$) was used. The computation results shown in FIGS. 12A to 12H match the schematic diagrams shown in FIGS. 5A to 5D.

FIGS. 13A, 13B, 13C, and 13D respectively show results when magnetic domain states which have been relaxed with the magnetic field in the +z direction being applied to the states in FIGS. 12E, 12F, 12G, and 12H. FIGS. 13E, 13F, 13G, and 13H respectively show results when the magnetic domain states have relaxed with the magnetic field in the −z direction applied to the states in FIGS. 12E, 12F, 12G, and 12H.

The computation results shown in FIGS. 13A, 13B, 13C, and 13D respectively match FIGS. 6A, 6B, 6C, and 6D, while the computation results shown in FIGS. 13E, 13F, 13G, and 13H respectively match FIGS. 7A, 7B, 7C, and 7D.

Figure 14:
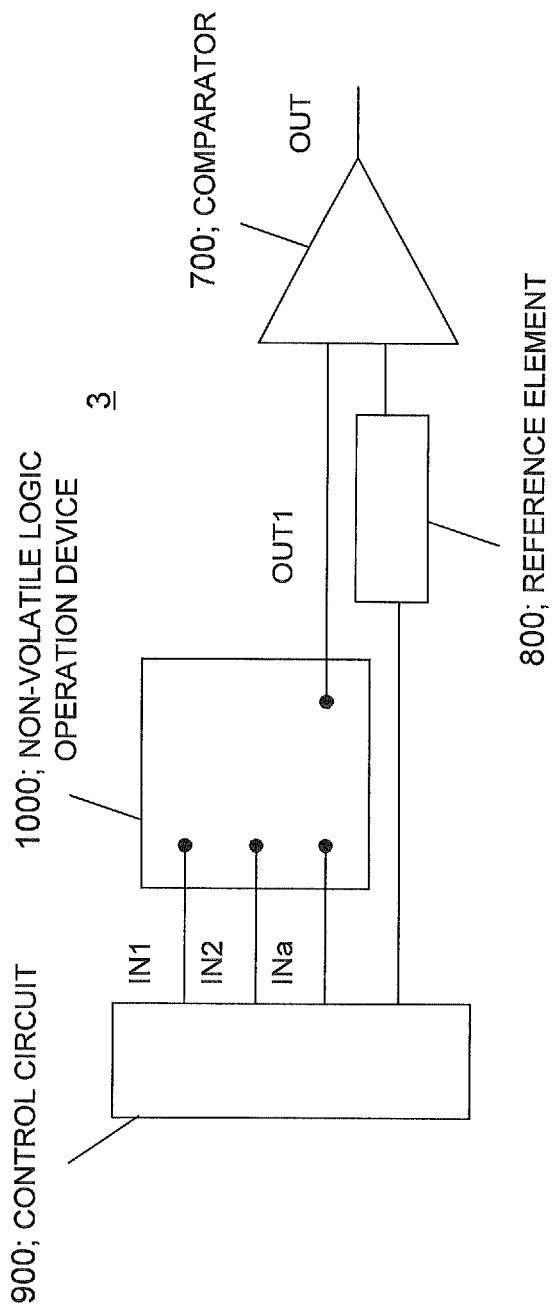
FIG. 14 is a diagram illustrating a circuit block configuration in the exemplary embodiment of the present invention.

Next, a circuit configuration of a logic gate using the non-volatile logic operation device 100 will be described. FIG. 14 is a block diagram illustrating an example of the logic gate in this exemplary embodiment. Referring to FIG. 14, a logic gate 3 includes a control circuit 900, the non-volatile logic operation device 1000, a reference element 800, and a comparator 700.

The control circuit 900 includes a switch (not shown) that converts each of a logic input and a logic control value into a current. The control circuit 900 generates a write current having a magnitude and a direction corresponding to control data not shown and then supplies the write current to the third input terminal INa of the non-volatile logic operation device 100, in response to the control data. The control circuit 900 generates a write current having a magnitude and a direction corresponding to each of first input data and second input data both not shown (supplied from an outside of the control circuit 900), in response to the first input data and the second input data, and then supplies the write current to each of the first input terminal IN1 and the second input terminal IN2 of the non-volatile logic operation device 1000. In a read operation, the control circuit 900 causes a read current for output to flow between one of the first input terminal IN1 and the second input terminal IN2 and the output terminal OUT1.

The operation of the non-volatile logic operation device 1000 is as explained with reference to FIGS. 4A to 10B. That is, based on supply of the write current from the third input terminal INa corresponding to the input data to the control circuit 900, and by supply of the read current, the non-volatile logic operation device 1000 outputs an output current (or an output voltage) as output data.

The reference element 800 is a TMR (Tunnel Magneto-Resistance) element (device) including an MTJ, for example. The MTJ reference element 800 has an appropriate reference resistance Rref, and outputs a reference current (or a reference voltage) corresponding to the reference resistance Rref according to control by the control circuit 900.

The comparator 700 compares the output current (or the output voltage) indicating the output data of the non-volatile logic operation device 1000 and the reference current (or the reference voltage) to output a comparison result as output data (indicating a binary value).

As described above, the non-volatile logic operation device 1000 can be set to be a desired logic circuit, and supply of input data to the non-volatile logic operation device 1000 and output of output data from the non-volatile logic operation device 1000 can also be executed.

The following describes materials that can be used for each of the operation layer 110, the first non-magnetic layer 120, the reference layer 130, the first magnetization fixed layer 140, the control layer 210, the second non-magnetic layer 220, and the second magnetization fixed layer 230.

Preferably, the operation layer 110 is formed of the ferromagnetic material having perpendicular magnetic anisotropy, as described above. More specifically, an alternate Layer-by-Layer film such as a Co/Pt laminated film, Co/Pd laminated film, a Co/Ni laminated film, a Co/Cu laminated film, Co/Ag laminated film, a Co/Au laminated film, a Fe/Pt laminated film, a Fe/Pd laminated film, or a Fe/Au laminated film is given as an example, in addition to an alloy-based material such as a Fe—Pt alloy, a Fe—Pd alloy, a Co—Pt alloy, a Co—Pd alloy, a Tb—Fe—Co alloy, a Gd—Fe—Co alloy, a Tb—Fe alloy, a Tb—Co alloy, a Gd—Fe alloy, a Gd—Co alloy, a Co—Cr—Pt alloy, a Co—Re—Pt alloy, a Co—Ru—Pt alloy, or a Co—W alloy. It is confirmed that the Co/Ni laminated film out of these materials can achieve current-induced domain wall motion having high controllability. Thus, the Co/Ni laminated film can be pointed out as a material suitable for the magnetization free region 115.

The first non-magnetic layer 120 is preferably formed of the insulating material. Specifically, Mg—O, Al—O, Al—N, or Ti—O is given as an example.

The reference layer 130 is formed of the ferromagnetic material having perpendicular magnetic anisotropy, for example. The material that can be used for the reference layer 130 is the same as the material given as the example that can be used for the operation layer 110. Thus, description of this material will be omitted. Preferably, the reference layer 130 is, if possible, formed of a hard magnetic material because it is demanded that magnetization of the reference layer 130 be stabilized and fixed. The Fe—Pt alloy, the Fe—Pd alloy, the Co—Pt alloy, the Co/Pt laminated film, or the Co/Pd laminated film is suitable in this respect. The magnetization direction of the reference layer 130 needs to be fixed in one direction, and it is further desirable that a leakage magnetic field to the outside be small. For this reason, it is desirable that the reference layer 130 has a laminated structure with laminated antiferromagnetic coupling. That is, it is suitable for the reference layer 130 to have a laminated configuration including a ferromagnetic material, Ru, and a ferromagnetic material, for example.

The reference layer 130 may be formed of a ferromagnetic material having in-plane magnetic anisotropy. In this case, any magnetic material may be used. Typically, Co—Fe may be used. An example of the exemplary embodiment where the material having in-plane magnetic anisotropy is used for the reference layer 130 will be described later, as a fourth variation example.

The first magnetization fixed layer 140 is formed of a ferromagnetic material having perpendicular magnetic anisotropy, for example. A material that can be used for the first magnetization fixed layer 140 is the same as the material given as the example of the material that can be used for the operation layer 110. Thus, description of this material will be omitted. However, preferably, the first magnetization layer 140 is, if possible, formed of a hard magnetic material because it is demanded that magnetization of the first magnetization fixed layer 140 be stabilized and fixed. The Fe—Pt alloy, the Fe—Pd alloy, the Co—Pt alloy, the Co/Pt laminated film, or the Co/Pd laminated film is suitable in this respect.

The control layer 210 is formed of the ferromagnetic material having perpendicular magnetic anisotropy, for example. The material (ferromagnetic material having the perpendicular magnetic anisotropy) that can be used for the control layer 210 is the same as the material given as the example of the material that can be used for the operation layer 110. Thus, description of this material will be omitted.

In this exemplary embodiment, the control layer 210 functions as a free layer for spin-transfer torque magnetization switching. Preferably, the damping constant of the material to be used is small so as to reduce switching current for the spin-transfer torque magnetization switching. It is suitable to use the Co/Ni laminated film, the Co/Pd laminated film, or an alloy including Pd in this respect.

Various materials can be used for the second non-magnetic layer 220. In a case where the insulating material is used for the second non-magnetic layer 220, for example, an MTJ is formed by the control layer 210, the second non-magnetic layer 220, and the second magnetization fixed layer 230. In this case, Mg—O, Al—O, Al—N, or Ti—O is given as an example of a material that can be used for the second non-magnetic layer 220.

Alternatively, a metal-based material can also be used for the second non-magnetic layer 220. In this case, a GMR (Giant Magneto-Resistance) configuration is formed by the control layer 210, the second non-magnetic layer 220, and the second magnetization fixed layer 230. When the GMR configuration is formed, Cu, Au, or Ag, for example, can be used for the second non-magnetic layer 220.

The second magnetization fixed layer 230 is formed of the ferromagnetic material having virtual magnetic anisotropy, for example. In this case, a material that can be used for the second magnetization fixed layer 230 is the same as the material given as the example of the material that can be used for the operation layer 110. Thus, description of this material will be omitted. However, it is demanded that magnetization of the second magnification fixed layer 230 be stabilized and fixed. Thus, preferably, the second magnetization fixed layer 230 is formed of a hard magnetic material, if possible. It is suitable to use the Fe—Pt alloy, the Fe—Pd alloy, the Co—Pt alloy, the Co/Pt laminated film, or the Co/Pd laminated film in this respect. The magnetization direction of the second magnetization fixed layer 230 needs to be fixed in one direction, and it is further desirable that a leakage magnetic field to the outside be small. For this reason, it is desirable that the reference layer 130 has a laminated structure with a laminated antiferromagnetic coupling, as described above. That is, it is suitable for the second magnetization fixed layer 230 to have a laminated configuration constituted from a ferromagnetic material, Ru, and a ferromagnetic material, for example.

The following describes an operation and effect of this exemplary embodiment of the present invention.

In the non-volatile logic operation device 1000, configuration information (control data) is stored in the control unit 2, especially in the control layer 210 (refer to FIGS. 2A and 2C). The control unit 2 can be regarded as a non-volatile memory using the GMK element or a TMR element. By using this non-volatile logic operation device 1000 (non-volatile memory), the need for including an another non-volatile memory for holding the configuration information at a time of power-off is eliminated. Accordingly, an increase in the area by the non-volatile memory to be provided together with the SRAM, which will become a problem in an FPGA, can be solved.

In the non-volatile logic operation device 1000, configuration information (control data) is stored in the control unit 2, especially in the control layer 210 (refer to FIGS. 2A and 2C). The control unit 2 can be regarded as a non-volatile memory using the GMR element or a TMR element. By using this non-volatile logic operation device 1000 (non-volatile memory), the need for including an SRAM for holding the configuration information at a time of power-off is eliminated. Accordingly, an increase in the area by the non-volatile memory to be provided together with the SRAM, which will become a problem in an FPGA, can be solved.

The operation unit 1 and the control unit 2 of the non-volatile logic operation device 1000 each use a magneto-resistance device such as the GMR device or the TMR device. However, the operation unit 1 and the control unit 2 function as a device which combines a logic device and a non-volatile memory, as a whole. For this reason, even if the magneto-resistance device is used, the size of the non-volatile logic operation device as a whole can be reduced.

Since the magneto-resistance device can operate at room temperature, the non-volatile logic operation device 1000 can operate at room temperature.

In some exemplary embodiments of the present invention, there are provided variation examples of the non-volatile logic operation device 1000 to be described as follows, for example:

First Variation Example

The operation unit 1 in the above-mentioned exemplary embodiment is formed of the operation layer 110, the first non-magnetic layer 120, and the reference layer 130. By utilizing current-induced domain wall motion and magnetic field-induced domain wall motion on the operation layer 130, the operation unit 1 performs a logic operation. The type of the operation unit 1 in the non-volatile logic operation device is not limited to this type. As an operation method of an operation unit 1 in exemplary embodiments of the present invention, spin-transfer torque magnetization switching rather than the current-induced domain wall motion may be utilized.

Figure 15A:
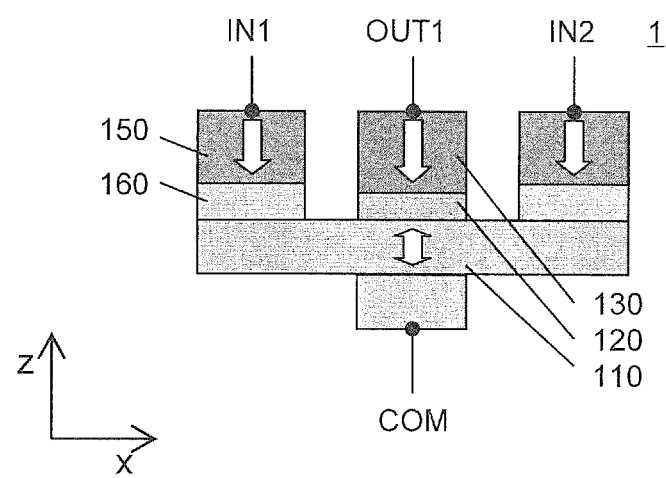
FIG. 15A is a sectional view schematically illustrating a configuration of a first variation example of the exemplary embodiment of the present invention.
Figure 15B:
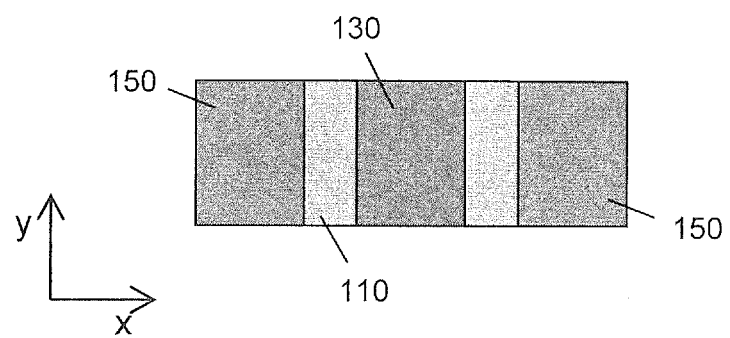
FIG. 15B is a plan view schematically illustrating a configuration of the first variation example of the exemplary embodiment of the present invention.
Figure 16A:
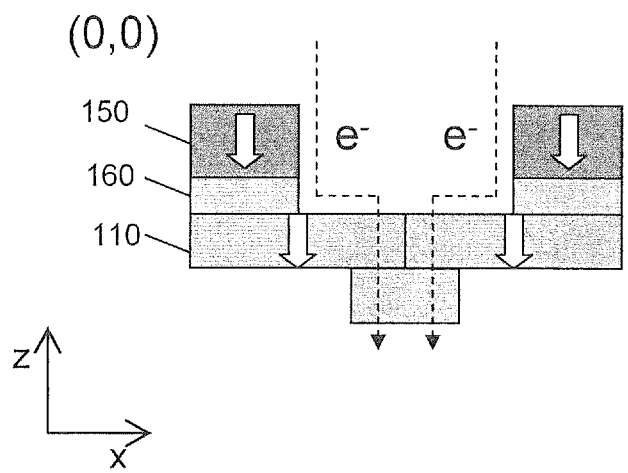
FIG. 16A is a diagram explaining an operation of the first variation example of the exemplary embodiment of the present invention.
Figure 16B:
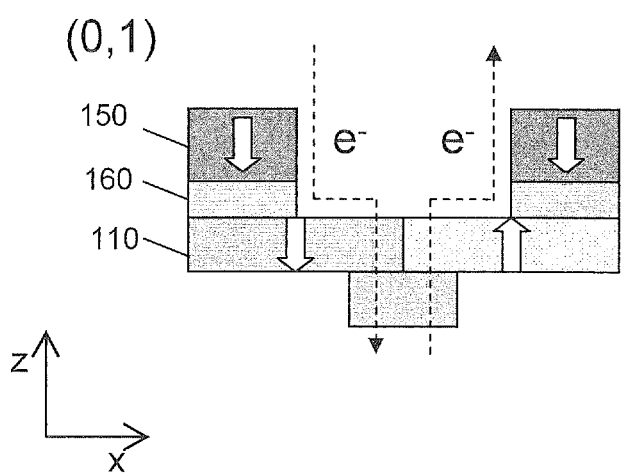
FIG. 16B is a diagram explaining an operation of the first variation example of the exemplary embodiment of the present invention.
Figure 16C:
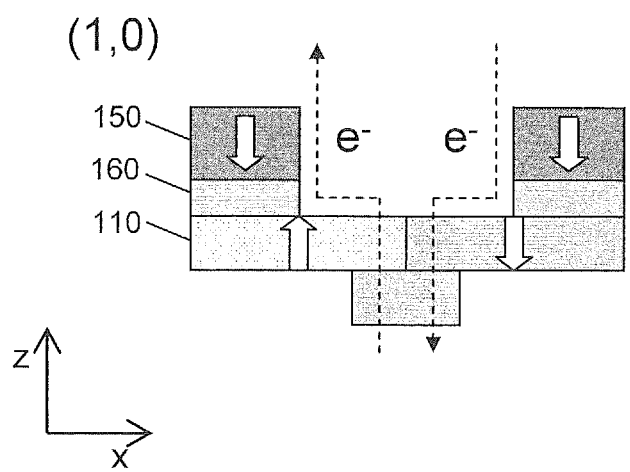
FIG. 16C is a diagram explaining an operation of the first variation example of the exemplary embodiment of the present invention.
Figure 16D:
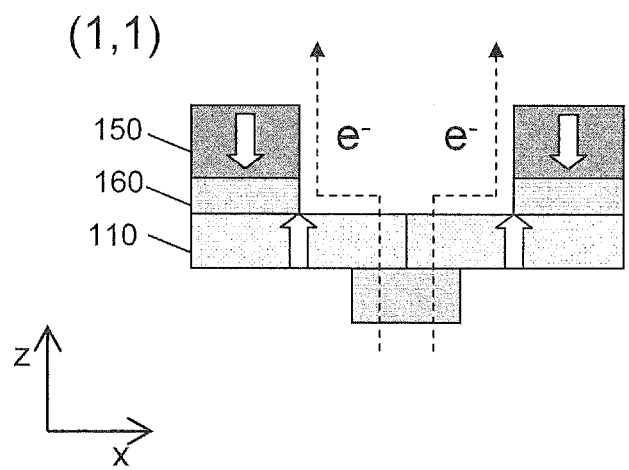
FIG. 16D is a diagram explaining an operation of the first variation example of the exemplary embodiment of the present invention.
Figure 17A:
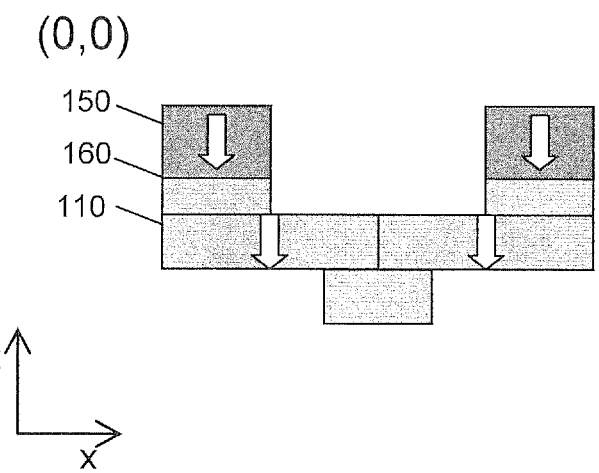
FIG. 17A is a diagram explaining an operation of the first variation example of the exemplary embodiment of the present invention.
Figure 17B:
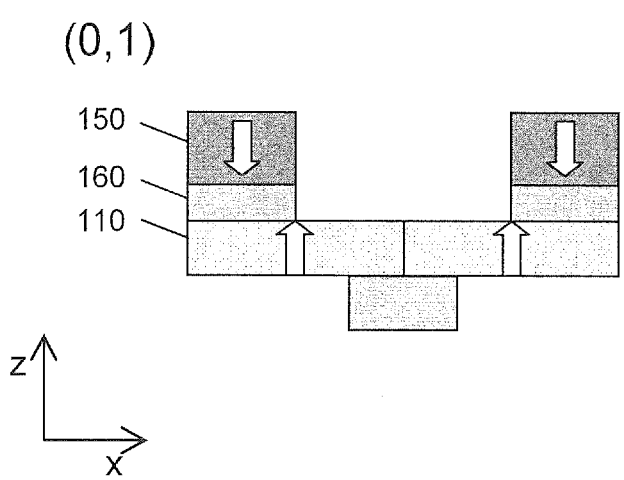
FIG. 17B is a diagram explaining an operation of the first variation example of the exemplary embodiment of the present invention.
Figure 17C:
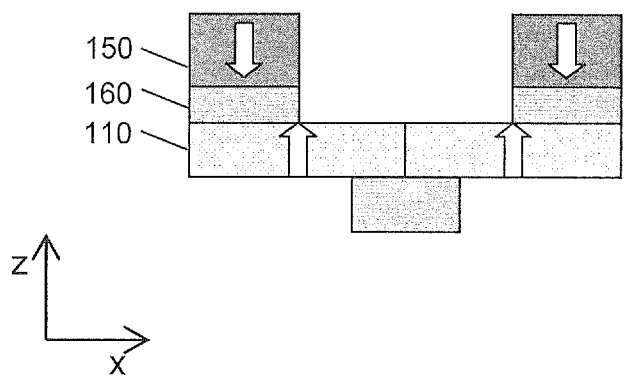
FIG. 17C is a diagram explaining an operation of the first variation example of the exemplary embodiment of the present invention.
Figure 17D:
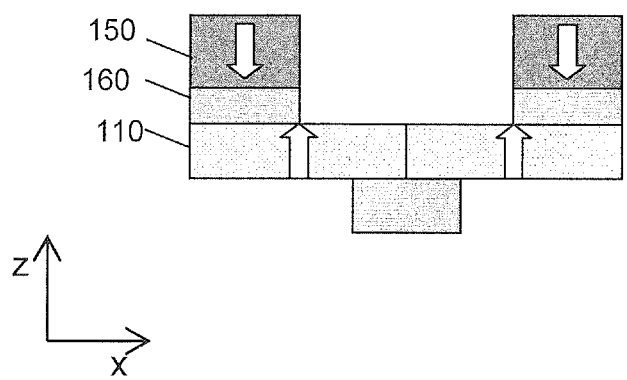
FIG. 17D is a diagram explaining an operation of the first variation example of the exemplary embodiment of the present invention.
Figure 18A:
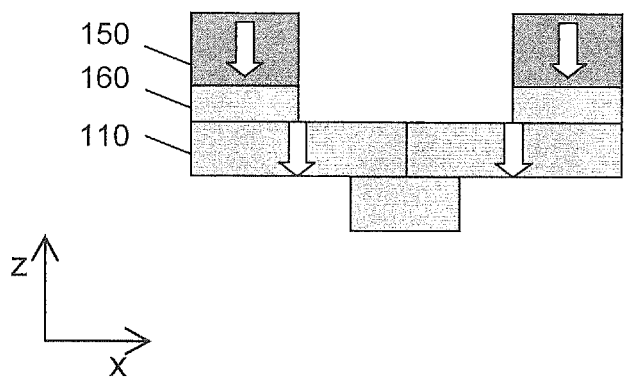
FIG. 18A is a diagram explaining an operation of the first variation example of the exemplary embodiment of the present invention.
Figure 18B:
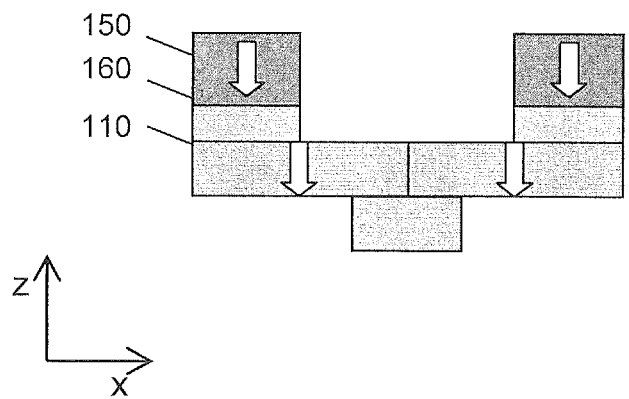
FIG. 18B is a diagram explaining an operation of the first variation example of the exemplary embodiment of the present invention.
Figure 18C:
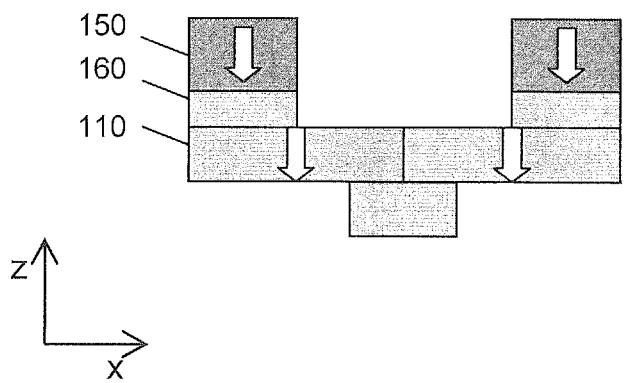
FIG. 18C is a diagram explaining an operation of the first variation example of the exemplary embodiment of the present invention.
Figure 18D:
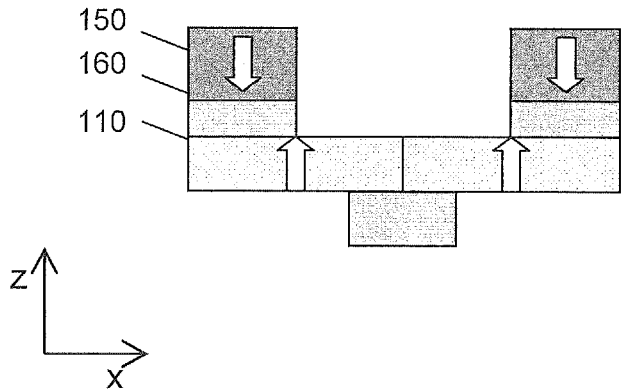
FIG. 18D is a diagram explaining an operation of the first variation example of the exemplary embodiment of the present invention.

Each of FIGS. 15A and 15B is a diagram schematically illustrating a configuration of a first variation example of the non-volatile logic operation device 1000 in the above-mentioned exemplary embodiment. FIG. 15A is a diagram schematically illustrating a configuration of a section of the operation unit 1. FIG. 15B is a diagram schematically illustrating a planar configuration of the operation unit 1. By using the configuration as shown in each of FIGS. 15A and 15B, a logic operation utilizing the magnetization switching by spin-torque transfer and the magnetic field-induced domain wall motion can be implemented.

As shown in FIG. 15A, the operation unit 1 is formed of an operation layer 110, a first non-magnetic layer 120, a reference layer 130, third magnetization fixed layers 150, and third non-magnetic layers 160.

The operation layer 110 is formed of a ferromagnetic material. The operation layer 110 includes a magnetization free region whose magnetization can be reversed over an entirety of the region. The operation layer 110 is connected to a common terminal COM.

The first non-magnetic layer 120 is formed of a non-magnetic material. The first non-magnetic layer 120 is provided adjacent to a part of the operation layer 110.

The reference layer 130 is formed of a ferromagnetic material. In the reference layer 130, a magnetization direction is fixed. The reference layer 130 is provided adjacent to the first non-magnetic layer 120 and opposite to the operation layer 110. The reference layer 130 is connected to an output terminal OUT1.

Each third non-magnetic layer 160 is formed of a non-magnetic material. At least two third non-magnetic layers 160 are provided. Each of the at least two third non-magnetic layers 160 is provided adjacent to a different part of the operation layer 110 (region different from the region where the reference layer 130 is arranged). As shown in FIG. 15A, two pieces of third non-magnetic layers 160 are provided.

Each third magnetization fixed layer 150 is formed of a ferromagnetic material. The magnetization direction of the third magnetization fixed layer 150 is fixed. The third magnetization fixed layer 150 is provided adjacent to the third non-magnetic layer 160 and opposite to the operation layer 110. The number of the third magnetization fixed layers 150 to be provided is the same as the number of the third non-magnetic layers 160. As shown in FIGS. 15A and 15B, two pieces of third magnetization fixed layers 150 are provided. The third magnetization fixed layers 150 are connected to a first input terminal IN1 and a second input terminal IN2. In the example shown in FIGS. 15A and 15B, magnetization directions of the two third magnetization fixed layers 150 are fixed to mutually parallel directions. In the case of FIGS. 15A and 15B, the magnetization directions are fixed in a −z direction.

Next, operation of the non-volatile logic operation device 1000 in the first variation example will be described. Each of FIGS. 16A to 16D is a diagram schematically illustrating an operation in the sectional view of FIG. 15A. FIGS. 16A to 16D respectively correspond to FIGS. 4A to 4D or FIGS. 5A to 5D. Each of FIGS. 4A to 4D or FIGS. 5A to 5D shows the example where the current-induced domain wall motion that occurs when a current is fed into the operation layer 110 is utilized for the operation. Each of FIGS. 16A to 16D shows the operation utilizing the spin-transfer torque magnetization switching.

FIGS. 16A, 16B, 16C, and 16D schematically and respectively show magnetization states, when signals (0, 0), (0,1), (1,0), and (1,1) are supplied to the first input terminal IN1 and the second input terminal IN2. The common terminal COM operates complementarily to each of the first input terminal IN1 and the second input terminal IN2. That is, when "0" is supplied to the first input terminal IN1, "1" is supplied to the common terminal COM. When "1" is supplied to the first input terminal IN1, "0" is supplied to the common terminal COM. Similarly, when "0" is supplied to the second input terminal IN2, "1" is supplied to the common terminal COM. When "1" is supplied to the second input terminal IN2, "0" is supplied to the common terminal COM. Referring to FIGS. 16A to 16D, broken-line arrows of conduction electrons (e−) show electron flows (in directions opposite to the directions of current).

As shown in FIGS. 16A to 16D, for the input signals (0, 0), (0, 1), (1, 0) and (1, 1), the following states of the operation layer 110 are respectively achieved:

the state (in FIG. 16A) where the entirety of magnetic domains in the operation layer 110 are magnetized in a downward direction (−z direction);

the state (in FIG. 16B) where a magnetic domain having upward magnetization and a magnetic domain having downward magnetization are present;

the state (in FIG. 16C) where a magnetic domain having upward magnetization and a magnetic domain having downward magnetization are present; and the state (in FIG. 16D) where the entirety of magnetic domains in the operation layer 110 are magnetized in an upward direction (+z direction).

Next, magnetization states which have relaxed under an external magnetic field in the +z direction from the states shown in FIGS. 16A to 16D are respectively shown in FIGS. 17A to 17D, and magnetization states which have relaxed under an external magnetic field in the −z direction from the states shown in FIGS. 16A to 16D are respectively shown in FIGS. 18A to 18D.

As shown in FIGS. 17A to 17D, a NOR operation is implemented in a case wherein the magnetization states have relaxed under the magnetic field in the +z direction. Further, it can be seen that, as shown in FIGS. 18A to 18D, a NAND operation is implemented in a case wherein the magnetization states have relaxed under the magnetic field in the −z direction.

In a step of feeding the input signals shown in each of FIGS. 16A to 16D, timings for feeding the input signals into the first input terminal IN1 and the second input terminal IN2 may be simultaneous or sequential (may be shifted back and forth in time).

Since a logic state change and output (reading) in the first variation example are the same as those in the above-mentioned exemplary embodiment, description of the logic stage change and the output will be omitted.

In the first variation example, there is shown an example where the current is introduced between each of the first input terminal IN1 and the second input terminal IN2 and the common terminal COM when the operation is performed. It may be so arranged that the common terminal COM is not provided, and that the output terminal OUT functions as the common terminal COM.

Each of the first non-magnetic layer 120 and the reference layer 130 can also be formed simultaneously with formation of the third non-magnetic layer 160 and the third magnetization fixed layer 150.

Second Variation Example

Figure 19:
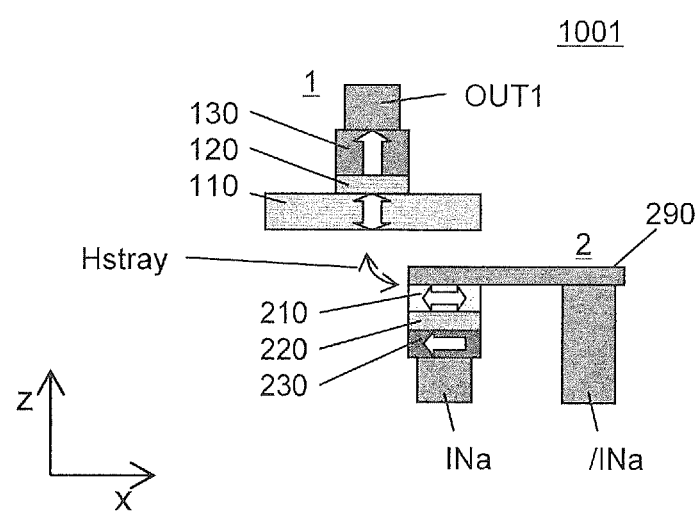
FIG. 19 is a sectional view schematically illustrating a configuration of a second variation example in the exemplary embodiment of the present invention.
Figure 20:
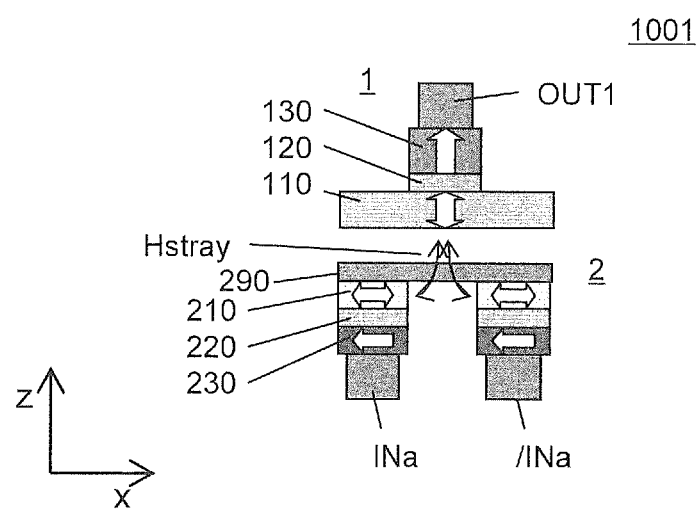
FIG. 20 is a sectional view schematically illustrating a configuration of the second variation example of the exemplary embodiment of the present invention.
Figure 21:
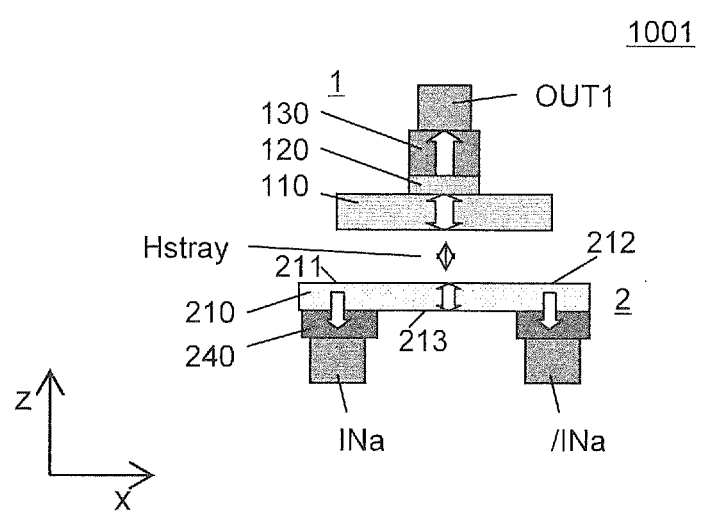
FIG. 21 is a sectional view schematically illustrating a configuration of the second variation example of the exemplary embodiment of the present invention.

Next, a second variation example will be described as a further another exemplary embodiment. Each of FIGS. 19, 20, and 21 schematically shows a structure of a non-volatile logic operation device in the second variation example. The second variation example relates to a type of a control unit 2. Each of FIGS. 19, 20, and 21 is a diagram schematically illustrating a configuration of a section of a non-volatile operation device 1001.

The control unit 2 in the above-mentioned exemplary embodiment is formed of the control layer 210, the second non-magnetic layer 220, and the second magnetization fixed layer 230. The control unit 2 is so configured that the magnetization direction of the control layer 210 is reversed by utilizing spin-transfer torque magnetization switching among these layers, thereby changing the state of the control unit 2, or the logic state of the non-volatile logic operation device 1000. Then, each of the control layer 210 and the second magnetization fixed layer 230 is formed of the ferromagnetic material having perpendicular magnetic anisotropy.

The type of the control unit 2 in the non-volatile logic operation device is not limited to such a configuration. Each of the control layer 210 and a second magnetization fixed layer 230 in the non-volatile logic operation device 1001 may be configured to have in-plane magnetic anisotropy, as shown in each of FIGS. 19 and 20.

Current-driven domain wall motion rather than the spin-torque transfer magnetization switching may be utilized, as shown in FIG. 21.

Each of the control layer 210, a second non-magnetic layer 220, and the second magnetization fixed layer 230 in the non-volatile logic operation device 1001 shown in FIG. 19 is provided so that the centers of the control layer 210, the second non-magnetic layer 220, and the second magnetization fixed layer 230 are shifted with respect to an operation layer 110 within an x-y plane. In the example in FIG. 19, a laminated structure of the control layer 210, the second non-magnetic layer 220, and the second magnetization fixed layer 230 is provided shifted with respect to the operation layer 110 in an +x direction. In this case, a leakage magnetic field Hstray from the control layer 210 has components in ±z direction. Thus, logic operations similar to those in the above-mentioned exemplary embodiment become possible.

Each of the control layer 210 and the second magnetization fixed layer 230 of the non-volatile logic operation device 1001 shown in FIG. 20 is formed of a ferromagnetic material having in-plane magnetic anisotropy. A plurality of sets of the laminated structure formed of the control layer 210, a second non-magnetic layer 220, and the second magnetization fixed layer 230 are provided. In the example in FIG. 20, two sets of the laminated structure of the control layer 210, the second non-magnetic layer 220, and the second magnetization fixed layer 230 are provided in different regions. Each set of the laminated structure of the control layer 210, the second non-magnetic layer 220, and the second magnetization fixed layer 230 is provided so as to be decentered in the x-y plane with respect to an operation layer 110. In the example in FIG. 20, one of the two laminated structures is provided shifted with respect to the operation layer 110 in the −x direction, while the other of the two laminated structures is provided shifted with respect to the operation layer 110 in the +x direction.

The second magnetization fixed layer 230 in one of the two laminated structures is connected to a third input terminal INa, while the second magnetization fixed layer 230 in the other of the two laminated structures is connected to a complementary third input terminal /INa. Assume that magnetizations of the second magnetization fixed layers 230 in the two laminated structures are fixed in parallel directions (of the −x direction in FIG. 20). Then, magnetizations of the two control layers 210 turn on mutually anti-parallel directions when a current is flown between the third input terminal INa and the complementary third input terminal /INa. Accordingly, the two control layers 210 apply leakage magnetic fields in the ±z direction to the operation layer 110.

In the exemplary embodiment shown in FIG. 21, a control layer 210 is formed of a ferromagnetic material having perpendicular magnetic anisotropy, and both end portions of the control layer 210 are adjacent to fourth magnetization fixed layers 240. Two magnetization fixed layers 240 are provided, and those magnetization fixed layers 240 have magnetizations fixed to mutually parallel directions.

The both end portions of the control layer 210 are fixed in mutually anti-parallel directions by the two fourth magnetization fixed layers 240, and a region whose magnetization direction is variable is provided between the both end portions of the control layer 210.

Regions of the both end portions of the control layer 210 whose magnetization directions are fixed are a fifth magnetization fixed region 211 and a sixth magnetization fixed region 212, while the region between the fifth magnetization fixed region 211 and the sixth magnetization fixed region 212 whose magnetization direction is variable is a second magnetization free region 213.

The fifth magnetization fixed region 211 and the sixth magnetization fixed region 212 are respectively connected to the third input terminal INa and the complementary third input terminal /INa through the fourth magnetization fixed layers 240. By introducing a current between the third input terminal INa and the complementary third input terminal /INa, current-induced domain wall motion occurs within the control layer 210. This enables reversal of the magnetization direction of the second magnetization free region 213. Accordingly, a leakage magnetic field Hstray in the ±z direction can be applied to an operation layer 110 from the control layer 210.

Third Variation Example

Next, a third variation example will be described as a still another exemplary embodiment. Each of FIGS. 22 and 23A to 23C schematically shows a structure of a non-volatile logic operation device 1000 in the third variation example. The third variation example (exemplary embodiment) relates to fixation of magnetization of a magnetization fixed region of an operation layer 110, domain wall pinning, and positions of first magnetization fixed layers 140.

Figure 22:
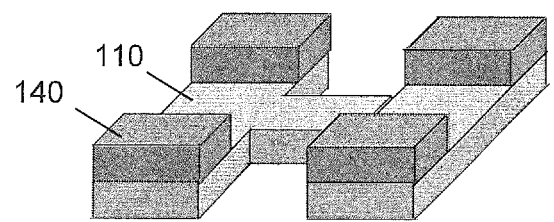
FIG. 22 is a perspective view schematically illustrating a configuration of a third variation example of the exemplary embodiment of the present invention.

In the above-mentioned exemplary embodiment explained with reference to FIGS. 2A, 2B, and 2C, the first magnetization fixed layers 140 are configured to be located on the side of a substrate (in the −z direction) with respect to the operation layer 110, being adjacent to the operation layer 110. Disposition of the first magnetization fixed layers 140 with respect to the operation layer 110 is, however, arbitrary. As shown in FIG. 22, for example, each first magnetization fixed layer 140 may be configured to be located on the opposite side of the substrate (in the +z direction) with respect to the operation layer 110, being adjacent to the operation layer 110. The first magnetization fixed layer 140 should fix magnetization of the magnetization fixed region of the operation layer 110, and does not necessarily have to be located adjacent to the operation layer 110 (may be located with a space or a different layer interposed between the first magnetization fixed layer 140 and the operation layer 110).

As described above, the pin site of a domain wall may be formed on the operation layer 110. Then, the first magnetization fixed layer 140 can be used in order to form this pin site of the domain wall.

Figure 23A:
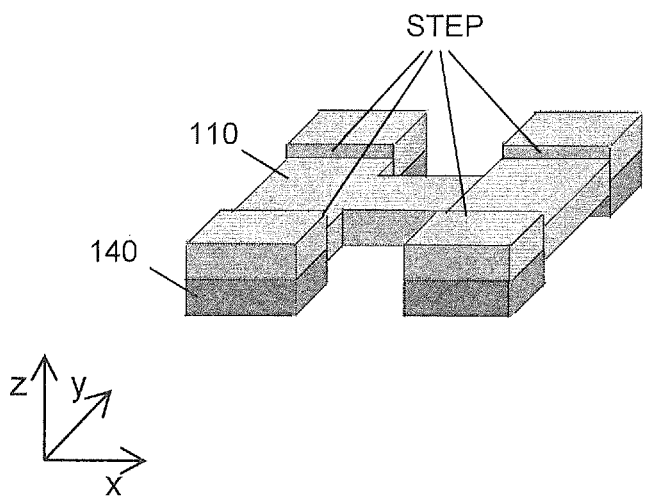
FIG. 23A is a perspective view schematically illustrating a configuration of a third variation example of the exemplary embodiment of the present invention.
Figure 23B:
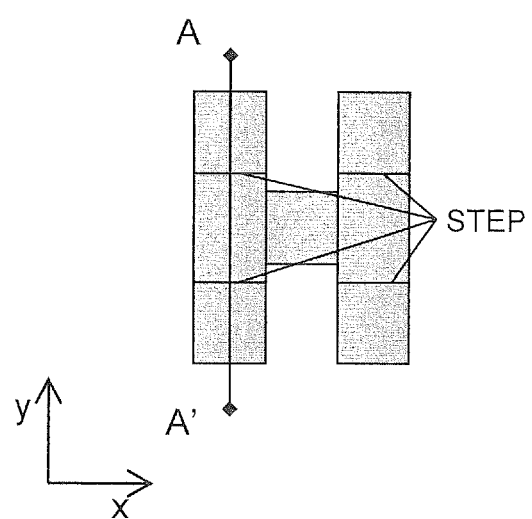
FIG. 23B is a plan view schematically illustrating a configuration of the third variation example of the exemplary embodiment of the present invention.
Figure 23C:
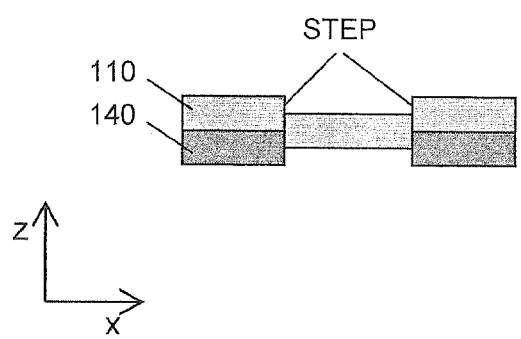
FIG. 23C is a sectional view schematically illustrating a configuration of the third variation example of the exemplary embodiment of the present invention.

Each of FIGS. 23A to 23C schematically shows a specific structure of this pin site. FIG. 23A is a perspective view, FIG. 23B is a plan view, and FIG. 23C is a diagram schematically illustrating a configuration of a section taken along a line A-A' in FIG. 23B. Steps STEP are formed on the operation layer 110 along the outer circumference of the first magnetization fixed layer 140. This step STEP can be functioned as the pin site of the domain wall. The first magnetization fixed layer 140 does not need to be formed of a ferromagnetic material if the step is just formed. Any material can be used for the first magnetization fixed layer 140.

Fourth Variation Example

Figure 24A:
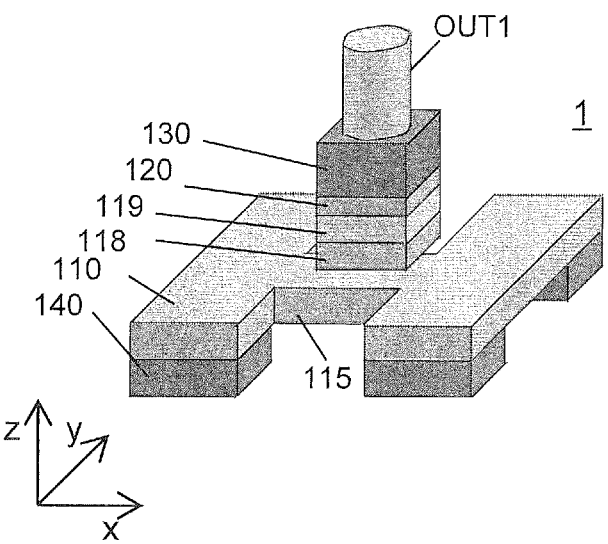
FIG. 24A is a perspective view schematically illustrating a configuration of a fourth variation example of the exemplary embodiment of the present invention.
Figure 24B:
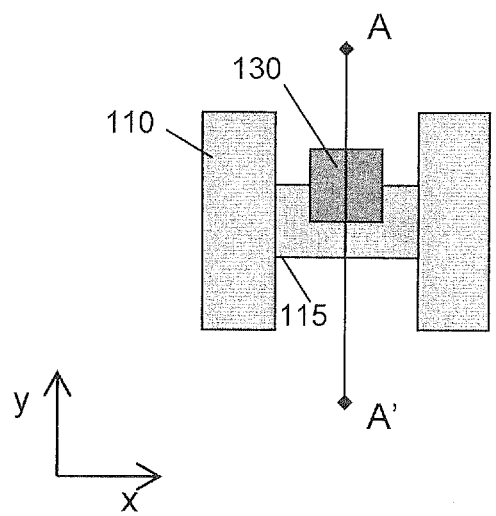
FIG. 24B is a plan view schematically illustrating a configuration of the fourth variation example of the exemplary embodiment of the present invention.
Figure 24C:
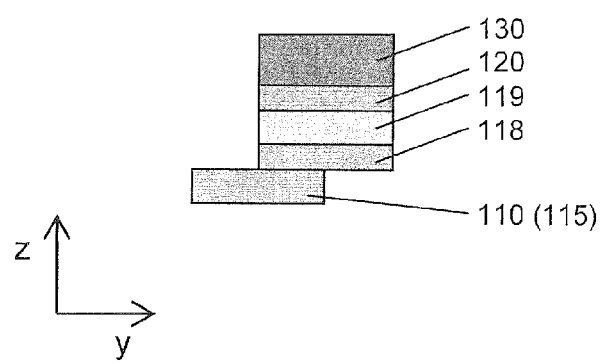
FIG. 24C is a sectional view schematically illustrating a configuration of the fourth variation example of the exemplary embodiment of the present invention.

A fourth variation example will be described as a still further another exemplary embodiment. Each of FIGS. 24A to 24C schematically shows a structure of a non-volatile logic operation device 1000 in the fourth variation example. The fourth variation example relates to a read method. FIG. 24A shows a perspective view, FIG. 24B shows a plan view, and FIG. 24C shows a section taken along a line A-A' in FIG. 24B. Referring to FIGS. 24A to 24C, only an operation unit 1 of the non-volatile logic operation device 1000 is shown.

A first non-magnetic layer 120 and a reference layer 130 are provided in order to read information from an operation layer 110. In the above-described exemplary embodiment, the description is given about the case where the first non-magnetic layer 120 and the reference layer 130 are provided adjacent to the operation layer 110.

A sensor layer 119 is newly provided in the fourth variation example. Preferably, a contact layer 118 is further provided. The contact layer 118, the sensor layer 119, the first non-magnetic layer 120, and the reference layer 130 are laminated on the operation layer 110 in this stated order, and a magnetic tunnel junction (Magnetic Tunnel Junction; MTJ) is formed by these layers. Preferably, the gravity center of the sensor layer 119 is provided shifted in an x-y plane with respect to the gravity center of a magnetization free region 115 of the operation layer 110. The direction of this shift (y direction) is defined as a first direction.

Each of the sensor layer 119 and the reference layer 130 is formed of a ferromagnetic material having in-plane magnetic anisotropy. The magnetic anisotropic direction of the sensor layer 119 can assume any direction in an in-plane direction.

On the other hand, magnetization of the reference layer 130 is substantially fixed in one direction. Preferably, this direction is parallel to the first direction. The example in each of FIGS. 24A to 24C shows an example where the first direction is the y direction or is a direction orthogonal to a longitudinal direction of the operation layer 110. The first direction, however, is arbitrary, and may be an x direction, for example.

According to the fourth variation example, information stored in a magnetizing direction perpendicular to the magnetization free region 115 can be read by the MTJ having in-plane magnetization formed of the sensor layer 119, the first non-magnetic layer 120, and the reference layer 130.

In a "0" state where the magnetization free region 115 is magnetized in an upper direction (+z direction), magnetization of the sensor layer 119 is oriented in a Y-axis positive direction due to leakage magnetic flux generated by magnetization of the magnetization free region 115 in the upper direction (+z direction). This orientation of the magnetization of the sensor layer 119 occurs because the sensor layer 119 is arranged on the upper side (z-axis positive direction) of the magnetization free region 115, and a gravity center of the sensor layer 119 is provided shifted in the y-axis positive direction (+y direction) with respect to the magnetization free region 115. With this arrangement, magnetizations of the sensor layer 119 and the reference layer 130 become parallel to each other. This MTJ thereby assumes a low-resistance state.

On the other hand, in a "1" state where the magnetization free region 115 is magnetized in a lower direction (−z direction), magnetization of the sensor layer 119 is oriented in a Y-axis negative direction due to leakage magnetic flux generated by magnetization of the magnetization free region 115 in the lower direction. With this arrangement, magnetizations of the sensor layer 119 and the reference layer 130 become mutually anti-parallel. This MTJ thereby assumes a high-resistance state.

In this manner, information which is stored as magnetization in the perpendicular direction of the magnetization free region 115 is transmitted to magnetization of the sensor layer 119 having in-plane magnetization, and can be read by MTJ configured by in-plane magnetization. Generally, in the MTJ configured by in-plane magnetization, a high magneto-resistance ratio (MR ratio) can be obtained. This allows a large read signal to be obtained.

Each of the sensor layer 119 and the reference layer 130 is formed of a material having in-plane magnetic anisotropy. Specifically, Co—Fe—B is given as an example of the material.

Preferably, the first magnetic layer 120 is formed of a non-magnetic material. More specifically, Mg—O or the like is given as an example of the material.

Fifth Variation Example

Figure 25A:
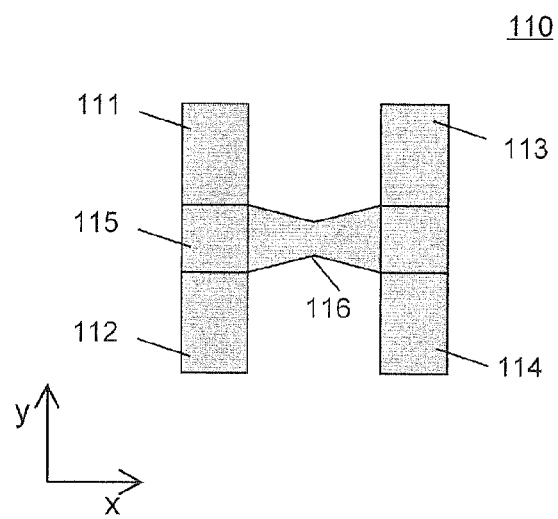
FIG. 25A is a plan view explaining a fifth variation example of the exemplary embodiment of the present invention.
Figure 25B:
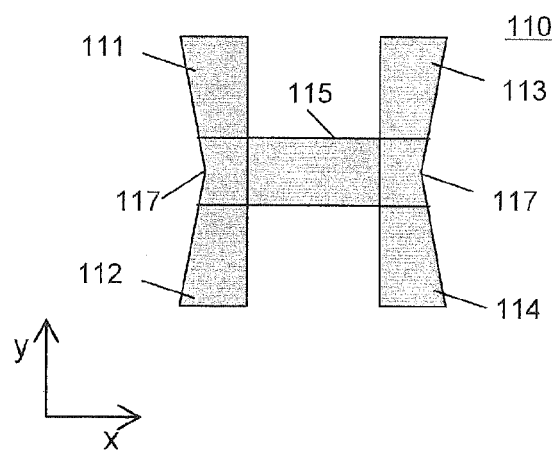
FIG. 25B is a plan view explaining the fifth variation example of the exemplary embodiment of the present invention.

Next, a fifth variation example will be described as a yet further another exemplary embodiment. Each of FIGS. 25A to 25B schematically shows a configuration of a non-volatile logic operation device 1000 in the fifth variation example. The fifth variation example relates to a shape of an operation layer 110. Each of FIGS. 25A and 25B is a plan view of the operation layer 110. The planar shape of the operation layer 110 in the non-volatile logic operation device in this exemplary embodiment has arbitrariness. As shown in FIG. 25A, for example, the operation layer 110 may be formed such that a magnetization free region 115 has a width reduced in a y direction at a central portion 116 (central portion of a transverse bar region of an H-type shape).

Alternatively, the operation layer 110 may be formed such that the magnetization free region 115 has a width reduced in an x direction, as shown in FIG. 25B.

Though no particular limitation is imposed, in the planar shape shown in FIG. 25B, opposite sides (outer sides) of the first and second magnetization fixed regions 111 and 112, which are opposite to sides (inner sides) respectively facing the third and fourth magnetization fixed regions 113 and 114, are narrowed more as they approach from respective ends of the first and second magnetization fixed regions 111 and 112, on opposite sides of the magnetization free region 115 toward the magnetization free region 115 (the transverse line in an H-type shape) (which means that each of the first and second magnetization fixed regions 111 and 112 has a tapered shape). The end portion (left-side end portion in FIG. 25B) of the magnetization free region 115 extending flush with the outer sides of the first and second magnetization fixed regions 111 and 112 includes a concave portion 117. Opposite sides (outer sides) of the third and fourth magnetization fixed regions 113 and 114, which are opposite to other sides (inner sides) respectively facing the first and second magnetization fixed regions 111 and 112, are narrowed more as they approach from respective ends of the third and fourth magnetization fixed regions 113 and 114, on opposite sides of the magnetization free region 115 toward the magnetization free region 115 (the transverse line in an H-type shape) (which means that each of the third and fourth magnetization fixed regions 113 and 114 has a tapered shape). The end portion (right-side end portion in FIG. 25B) of the magnetization free region 115 extending flush with the outer sides of the third and fourth magnetization fixed regions 113 and 114 includes a concave portion 117.

In a case wherein current-induced domain wall motion is utilized for an operation, it is effective to design the shape of the operation layer 110 such that a current density in the central portion of the magnetization free region 115 is not reduced much or to design the shape of the operation layer 110 such that an unnecessary pin site is not formed, in order to perform the operation shown in each of FIGS. 4A to 4D and each of FIGS. 5A and 5B with a higher yield.

Each of FIGS. 25A and 25B shows the shape by which a satisfactory operation in terms of that respect can be expected. In addition to these arrangements, a notch (notch) or the like may be provided to intentionally form the pin site of a domain wall.

INDUSTRIAL APPLICABILITY

As application examples of the present invention, logic operation devices to be used in a cellular phone, a portable information terminal, a mobile personal computer, or a PDA (Personal Digital Assistant), or a microcomputer including a logic operation device to be used for a vehicle or the like may be pointed out.

The whole or part of the some exemplary embodiments described above are described as, but not limited to the following supplementary notes:

(Supplementary Note 1)
A non-volatile logic operation device comprising:
  an operation unit that is connected to a first input terminal, a second input terminal, and an output terminal and that includes an operation layer, a first non-magnetic layer, and a reference layer, the operation unit outputting from the output terminal a result of a logic operation on signals applied at the first input terminal and the second input terminal; and
  a control unit that is connected to a third input terminal and that includes a control layer, the control unit being arranged in the vicinity of the operation unit.

(Supplementary Note 2)
The non-volatile logic operation device according to Supplementary Note 1, wherein the operation layer includes a ferromagnetic material having perpendicular magnetic anisotropy.

(Supplementary Note 3)
The non-volatile logic operation device according to Supplementary Note 1 or 2, wherein the control unit exerts a magnetic interaction on the operation unit. The control unit exerts mutually different first and second magnetic interactions on the operation unit, and performs a different logic operation on the signals applied at the first input terminal and the second input terminal, according to a signal supplied to the third input terminal.

(Supplementary Note 4)
The non-volatile logic operation device according to Supplementary Note 3, wherein the magnetic interaction is a magnetostatic interaction.

(Supplementary Note 5)
The non-volatile logic operation device according to any one of Supplementary Notes 1 to 4, wherein the operation layer comprises:
  a first magnetization fixed region;
  a second magnetization fixed region;
  a third magnetization fixed region;
  a fourth magnetization fixed region; and
  a magnetization free region;
  the first magnetization fixed region is connected to the first input terminal, wherein
  the third magnetization fixed region is connected to the second input terminal.

(Supplementary Note 6)
The non-volatile logic operation device according to Supplementary Note 5, wherein the operation layer has a planar shape including two three-forked portions.

(Supplementary Note 7)
The non-volatile logic operation device according to Supplementary Note 5, comprising
  a first magnetization fixed layer arranged in the vicinity of the operation layer.

(Supplementary Note 8)
The non-volatile logic operation device according to any one of Supplementary Notes 1 to 4, comprising:
  a third non-magnetic layer located adjacent to the operation layer; and
  a third magnetization fixed layer located adjacent to the third non-magnetic layer and opposite to the operation layer.

(Supplementary Note 9)
The non-volatile logic operation device according to any one of Supplementary Notes 1 to 8, comprising:
  a second non-magnetic layer located adjacent to the control layer; and
  a second magnetization fixed layer located adjacent to the second non-magnetic layer and opposite to the control layer.

(Supplementary Note 10)
The non-volatile logic operation device according to Supplementary Note 9, wherein the control layer includes a ferromagnetic material having perpendicular magnetic anisotropy.

(Supplementary Note 11)
The non-volatile logic operation device according to Supplementary Note 9, wherein the control layer includes a ferromagnetic material having in-plane magnetic anisotropy.

(Supplementary Note 12)
The non-volatile logic operation device according to any one of Supplementary Notes 1 to 8, wherein the control layer includes:
  a fifth magnetization fixed region,
  a sixth magnetization fixed region, and
  a second magnetization free region.

(Supplementary Note 13)
The non-volatile logic operation device according to any one of Supplementary Note 12, wherein a fourth magnetization fixed layer is arranged in the vicinity of the control layer.

(Supplementary Note 14)
The non-volatile logic operation device according to Supplementary Note 1, wherein, in the operation unit, each of the operation layer and the reference layer is formed of a ferromagnetic material having perpendicular magnetic anisotropy, wherein
  the operation layer includes a magnetization free region whose magnetization is reversible,
  the first non-magnetic layer is formed of a non-magnetic material and is provided adjacent to the magnetization free region of the operation layer,
  the reference layer has a fixed magnetization direction, and is provided adjacent to the first non-magnetic layer and opposite to the operation layer, and
  the operation layer, the first non-magnetic layer, and the reference layer form a laminated structure. (FIGS. 2A, 2B, and 2C)

(Supplementary Note 15)
The non-volatile logic operation device according to Supplementary Note 14, wherein the control unit includes:
  the control layer;
  a second non-magnetic layer; and
  a second magnetization fixed layer, each of the control layer and the second magnetization fixed layer being formed of a ferromagnetic material having perpendicular magnetic anisotropy, wherein
  the control layer is connected to an electrically conducting layer, and arranged spaced from and opposite to the magnetization free region of the operation layer with a predetermined space interposed between the control layer and the magnetization free region, the second non-magnetic layer is formed of a non-magnetic material and arranged adjacent to the control layer and opposite to the electrically conducting layer, the second magnetization fixed layer is provided adjacent to the second non-magnetic layer and opposite to the control layer, and the control layer, the second non-magnetic layer, and the second magnetization fixed layer form a laminated structure. (FIGS. 2A, 2B, and 2C)

(Supplementary Note 16)

The non-volatile logic operation device according to Supplementary Note 14 or 15, wherein the operation layer includes at least two magnetization fixed regions respectively arranged adjacent to the magnetization free region and mutually spaced from each other, as a planar shape, and having magnetizations thereof fixed in a same direction, the first input terminal and the second input terminal are respectively connected to the two magnetization fixed regions, and the third input terminal is connected to the second magnetization fixed layer of the control unit. (FIGS. 2A, 2B, and 2C, and FIGS. 3A and 3B)

(Supplementary Note 17)

The non-volatile logic operation device according to Supplementary Note 1, wherein in the operation unit, the operation layer and the reference layer are each formed of a ferromagnetic material having perpendicular magnetic anisotropy, wherein the operation layer includes a magnetization free region whose magnetization is reversible, the first non-magnetic layer is formed of a non-magnetic material and is provided adjacent to the magnetization free region of the operation layer, the reference layer has a fixed magnetization direction and is provided adjacent to the first non-magnetic layer and opposite to the operation layer, and the operation layer, the first non-magnetic layer, and the reference layer form a laminated structure, wherein
the control unit includes:
the control layer;
a second non-magnetic layer; and
a second magnetization fixed layer, wherein
the control layer and the second magnetization fixed layer are each formed of a ferromagnetic material having perpendicular magnetic anisotropy, the control layer is connected to an electrically conducting layer and is arranged spaced from and opposite to the magnetization free region of the operation layer with a predetermined space interposed between the control layer and the magnetization free region, the second non-magnetic layer is formed of a non-magnetic material, and is provided adjacent to the control layer and opposite to the electrically conducting layer, the second magnetization fixed layer is provided adjacent to the second non-magnetic layer and opposite to the control layer, the control layer, the second non-magnetic layer, and the second magnetization fixed layer form a laminated structure, wherein
the operation layer includes
at least two magnetization fixed regions respectively arranged adjacent to the magnetization free region and mutually spaced from each other, as a planar shape, and having magnetizations thereof fixed in a same direction, wherein
the first input terminal and the second input terminal are respectively connected to the two magnetization fixed regions, and the third input terminal is connected to the second magnetization fixed layer of the control unit. (FIGS. 2A, 2B, 2C, 3A, and 3B)

(Supplementary Note 18)

The non-volatile logic operation device according to Supplementary Note 17, wherein the operation layer has, as a planar shape thereof, an H-type shape formed of two parallel vertical line regions and one transverse line region crossing the two vertical line regions, first and third regions of the two vertical line regions located on one side of the transverse line region are respectively made up of first and third magnetization fixed regions whose magnetizations are fixed, second and fourth regions of the two vertical line regions located on a side opposite to the one side of the transverse line region are respectively made up of second and fourth magnetization fixed regions whose magnetizations are fixed, the transverse line region is made up of the magnetization free region whose magnetization is reversible, the first input terminal and a complementary first input terminal that operates complementarily to the first input terminal are respectively connected to the first magnetization fixed region and the second magnetization fixed region, the second input terminal and a complementary second input terminal that operates complementarily to the second input terminal are respectively connected to the third magnetization fixed region and the fourth magnetization fixed region, and the third input terminal is connected to the second magnetization fixed layer, and a complementary third input terminal that operates complementarily to the third input terminal is connected to the electrically conducting layer. (FIGS. 3A and 3B)

(Supplementary Note 19)

The non-volatile logic operation device according to any one Supplementary Notes 16 to 18, comprising a first magnetization fixed layer that fixes magnetizations of the magnetization fixed regions of the operation layer.

(Supplementary Note 20)

The non-volatile logic operation device according to Supplementary Note 19, wherein the first magnetization fixed layer is provided opposite to a substrate with respect to the operation layer. (FIG. 22)

(Supplementary Note 21)

The non-volatile logic operation device according to Supplementary Note 17 or 18, wherein the first magnetization fixed region and the second magnetization fixed region have magnetizations fixed in mutually anti-parallel directions, the third magnetization fixed region and the fourth magnetization fixed region have magnetizations fixed in mutually anti-parallel directions, and the first magnetization fixed region and the third magnetization fixed region have magnetizations fixed in a same direction. (FIGS. 3A and 3B)

(Supplementary Note 22)

The non-volatile logic operation device according to Supplementary Note 1, wherein the operation unit includes a laminated structure of the first non-magnetic layer and the reference layer on a magnetization free region of the operation layer whose magnetization is reversible, the operation layer and the reference layer are each formed of a ferromagnetic material having perpendicular magnetic anisotropy, the first non-magnetic layer is formed of a non-magnetic material and is provided adjacent to the magnetization free region of the operation layer, the reference layer has a fixed magnetization direction, and is provided adjacent to the first non-magnetic layer and opposite to the operation layer, the operation layer has, as a planar shape thereof, an H-type shape formed of two parallel vertical line regions and one transverse line region crossing the two vertical line regions, first and third regions of the two vertical line regions located on one side of the transverse line region are respectively made up of first and third magnetization fixed regions whose magnetizations are fixed, second and fourth regions of the two vertical line regions located on a side opposite to the one side of the transverse line region are respectively made up of second and fourth magnetization fixed regions whose magnetizations are fixed, the transverse line region is made up of the magnetization free region whose magnetization is reversible, the control unit comprises a laminated structure of the control layer, a second non-magnetic layer, and a second magnetization fixed layer, the control layer and the second magnetization fixed layer are each formed of a ferromagnetic material having perpendicular magnetic anisotropy, the control layer is connected to an electrically conducting layer, and is arranged spaced from and opposite to the magnetization free region of the operation layer with a predetermined space interposed between the control layer and the magnetization free region, the second non-magnetic layer is formed of a non-magnetic material, and is provided adjacent to the control layer and opposite to the electrically conducting layer, the second magnetization fixed layer is provided adjacent to the second non-magnetic layer and opposite to the control layer, the first input terminal and a complementary first input terminal that operates complementarily to the first input terminal are respectively connected to the first magnetization fixed region and the second magnetization fixed region, the second input terminal and a complementary second input terminal that operates complementarily to the second input terminal are respectively connected to the third magnetization fixed region and the fourth magnetization fixed region, the third input terminal is connected to the second magnetization fixed layer, and the complementary third input terminal that operates complementarily to the third input terminal is connected to the electrically conducting layer, the first magnetization fixed region and the second magnetization fixed region have magnetizations fixed in mutually anti-parallel directions, the third magnetization fixed region and the fourth magnetization fixed region have magnetizations fixed in mutually anti-parallel directions, and the first magnetization fixed region and the third magnetization fixed region have magnetizations fixed in a same direction. (FIGS. 2A, 2B and 2C and FIGS. 3A and 3B)

(Supplementary Note 23)

The non-volatile logic operation device according to any one of Supplementary Notes 14 to 22, wherein the operation layer, the first non-magnetic layer, and the reference layer form an MTJ (Magnetic Tunnel Junction) to exhibit a tunnel magneto-resistance effect.

(Supplementary Note 24)

The non-volatile logic operation device according to Supplementary Note 23, wherein a magnetization state of the operation layer converges to one of two states, in accordance with a state of the control layer determined by values of signals at the first and second input terminals and the third input terminal, and the magnetization state of the operation layer is converted into an output signal as a resistance difference of the laminated structure formed of the operation layer, the first non-magnetic layer, and the reference layer. (FIGS. 10A and 10B)

(Supplementary Note 25)

The non-volatile logic operation device according to any one of Supplementary Notes 16, 18, and 22, wherein a magnetization direction of the control layer is switched by a direction of a current flowing between the third input terminal and the complementary third input terminal. (FIGS. 9A and 9B)

(Supplementary Note 26)

A logic circuit device comprising:

a control circuit that generates a write current in response to a control signal and supplies the generated write current to the third input terminal of the non-volatile logic operation device as set forth in any one of Supplementary Notes 1 to 25, generates a write signal in response to first input data and second input data and supplies the write signal to the first input terminal and the second input terminal of the non-volatile logic operation device, and supplies a read signal for output between the output terminal and one of the first input terminal and the second input terminal;

a reference element including a reference resistance, the reference element outputting a reference signal corresponding to the reference resistance according to control of the control circuit;

the non-volatile logic operation device as set forth in any one of Supplementary Notes 1 to 25; and a comparator that compares an output signal from the output terminal of the non-volatile logic operation device and the reference signal and then outputs a result of the comparison as a binary signal. (FIG. 14)

(Supplementary Note 27)

The non-volatile logic operation device according to Supplementary Note 1, wherein the operation unit includes a laminated structure of the reference layer and the first non-magnetic layer provided on the operation layer, wherein the first non-magnetic layer is formed of a non-magnetic material and is provided adjacent to the operation layer, and the reference layer is formed of a ferromagnetic material, has a fixed magnetization direction, and is arranged adjacent to the first non-magnetic layer and opposite to the operation layer, wherein the non-volatile logic operation device comprises:

at least two laminated structures each formed of a third magnetization fixed layer and a third non-magnetic layer provided on the operation layer, wherein the third non-magnetic layer is formed of a non-magnetic material and is provided adjacent to the operation layer, the third magnetization fixed layer is formed of a non-magnetic material, has a fixed magnetization direction, and is provided adjacent to the third non-magnetic layer and opposite to the operation layer, the operation layer is formed of a ferromagnetic material having perpendicular magnetic anisotropy and has magnetization that may be reversible over an entire region of the operation layer, the operation layer being connected to a first common terminal on a side opposite to the laminated structures, and the first input terminal and the second input terminal are connected to two of the third magnetization fixed layers. (FIGS. 15A and 15B)

(Supplementary Note 28)
The non-volatile logic operation device according to Supplementary Note 27, wherein a signal to be supplied to the first input terminal or the second input terminal is made up of be complementary to a signal to be supplied to the common terminal. (FIG. 15A)

(Supplementary Note 29)
The non-volatile logic operation device according to Supplementary Note 14, wherein the control unit comprises:
the control layer;
a second non-magnetic layer; and
a second magnetization fixed layer, wherein
the control layer and the second magnetization fixed layer in the control unit are each formed of a ferromagnetic magnetic material having in-plane magnetic anisotropy,
the control layer is connected to an electrically conducting layer, and is arranged spaced from and opposite to the magnetization free region of the operation layer with a predetermined space interposed between the control layer and the magnetization free region,
the second non-magnetic layer is formed of a non-magnetic material and is provided adjacent to the control layer and opposite to the electrically conducting layer,
the second magnetization fixed layer is provided adjacent to the second non-magnetic layer and opposite to the control layer, and
the control layer, the second non-magnetic layer, and the second magnetization fixed layer form a laminated structure, and the center of the laminated structure is arranged shifted with respect to the laminated structure of the operation layer. (FIG. 19)

(Supplementary Note 30)
The non-volatile logic operation device according to Supplementary Note 1 or 14, including a plurality of laminated structures, each of the laminated structures including
the control layer;
the second non-magnetic layer; and
the second magnetization fixed layer,
the first and second input terminals being connected to the two magnetization fixed layers of two of the laminated structures. (FIG. 20)

(Supplementary Note 31)
The non-volatile logic operation device according to Supplementary Note 19, wherein a step is provided on the operation layer, corresponding to at least a portion of an outer circumference of the first magnetization fixed layer. (FIGS. 23A, 23B, and 23C)

(Supplementary Note 32)
The non-volatile logic operation device according to Supplementary Note 14, wherein the operation unit includes
a laminated structure including:
a sensor layer; the first non-magnetic layer; and the reference layer, adjacent sequentially on the operation layer, wherein
a gravity center of the sensor layer is shifted in a plane with respect to the magnetization free region of the operation layer,
the sensor layer and the reference layer are each formed of a ferromagnetic material having in-plane magnetic anisotropy,
a magnetic anisotropic direction of the sensor layer is arbitrary in an in-plane direction,
the reference layer has magnetization fixed in one direction, and
information stored in a magnetization direction perpendicular to the magnetic free region of the operation layer is read by an MTJ formed of the sensor layer, the first non-magnetic layer, and the reference layer and having in-plane magnetization. (FIGS. 24A, 24B and 24C)

(Supplementary Note 33)
The non-volatile logic operation device according to Supplementary Note 14, wherein the operation layer has, as a planar shape thereof, an H-type shape including two parallel vertical line regions and one transverse line region crossing the two vertical line regions, wherein
first and third regions of the two vertical line regions located on one side of the transverse line region are respectively made up of first and third magnetization fixed regions whose magnetizations are fixed,
second and fourth regions of the two vertical line regions located on a side opposite to the one side of the transverse line region are respectively made up of second and fourth magnetization fixed regions whose magnetizations are fixed,
the transverse line region is made up of the magnetization free region whose magnetization is reversible, and
the transverse line region has a width reduced at a longitudinal central portion thereof. (FIG. 25A)

(Supplementary Note 34)
The non-volatile logic operation device according to Supplementary Note 14, wherein the operation layer has a planar shape of an H-type shape including two parallel vertical line regions and one transverse line region crossing the two vertical line regions, wherein
first and third regions of the two vertical line regions located on one side of the transverse line region are respectively made up of first and third magnetization fixed regions whose magnetizations are fixed,
second and fourth regions of the two vertical line regions located on a side opposite to the one side of the transverse line region are respectively made up of second and fourth magnetization fixed regions whose magnetizations are fixed,
the transverse line region is made up of the magnetization free region whose magnetization is reversible, and wherein
a first end portion of the transverse line region extending to opposite sides of the first and second magnetization fixed regions which are opposite to sides respectively facing the third and fourth magnetization fixed regions, includes a concave portion, and
a second end portion of the transverse line region extending to opposite sides of the third and fourth magnetization fixed regions which are opposite to sides respectively facing the first and second magnetization fixed regions, includes a concave portion. (FIG. 25B)

(Supplementary Note 35)
The non-volatile logic operation device according to Supplementary Note 34, wherein opposite sides of the first and second magnetization fixed regions, which are opposite to sides thereof respectively facing the third and fourth magnetization fixed regions, are narrowed more as approaching from respective ends of the first and second magnetization fixed regions, on opposite sides of the magnetization free region toward the magnetization free region, and the first end portion of the magnetization free region extends flush with the opposite sides of the first and second magnetization fixed regions, and
opposite sides of the third and fourth magnetization fixed regions, which are opposite to sides thereof respectively facing the first and second magnetization fixed regions, are narrowed more as approaching from respective ends of the third and fourth magnetization fixed regions, on opposite sides of the magnetization free region toward the magnetization free region, and the second end portion of the magnetization free region extends flush with the opposite sides of the third and fourth magnetization fixed regions. (FIG. 25B)

(Supplementary Note 36)
The non-volatile logic operation device according to Supplementary Note 14, wherein the operation layer has a planar shape of an H-type shape formed of two parallel vertical line regions and one transverse line region crossing the two vertical line regions, first and third regions of the two vertical line regions located on one side of the transverse line region are respectively made up of first and third magnetization fixed regions whose magnetizations are fixed;

second and fourth regions of the two vertical line regions located on a side opposite to the one side of the transverse line region are respectively made up of second and fourth magnetization fixed regions whose magnetizations are fixed; and the transverse line region is made up of the magnetization free region whose magnetization is reversible, and includes a notch at a predetermined location thereof.

Each disclosure of the above-listed Patent Literatures is incorporated herein by reference. Modification and adjustment of each exemplary embodiment and each example are possible within the scope of the overall disclosure (including the claims) of the present invention and based on the technical concept of the present invention. Various combinations and selections of various disclosed elements (including each element in each claim, each element in each exemplary embodiment and each example, and each element in each drawing) are naturally possible within the scope of the claims of the present invention. That is, the present invention includes various variations and modifications that could be made by those skilled in the art according to the overall disclosure including the claims and the technical concept.

REFERENCE SIGNS LIST 1 operation unit
2 control unit
3 logic gate
110 operation layer
111 first magnetization fixed region
112 second magnetization fixed region
113 third magnetization fixed region
114 fourth magnetization fixed region
115 magnetization free region
116 central portion
117 concave portion
118 contact layer
119 sensor layer
120 first non-magnetic layer
130 reference layer
140 first magnetization fixed layer
150 third magnetization fixed layer
160 third non-magnetic layer
210 control layer
211 fifth magnetization fixed region
212 sixth magnetization fixed region
213 second magnetization free region
220 second non-magnetic layer
230 second magnetization fixed layer
240 fourth magnetization fixed layer
290 electrically conducting layer
700 comparator
800 reference element
900 control circuit
1000, 1001 non-volatile logic operation device

The invention claimed is:

1. A non-volatile logic operation device comprising:
first to third input terminals;
an output terminal;
an operation unit that is connected to the first input terminal, the second input terminal, and the output terminal, and that includes:
an operation layer;
a first non-magnetic layer; and
a reference layer, the operation unit performing a logic operation on signals applied at the first input terminal and the second input terminal to output from the output terminal a result of the logic operation; and
a control unit that is connected to the third input terminal and that includes a control layer, the control unit being arranged in a vicinity of the operation unit,
wherein the operation layer includes, as a planer shape thereof, an H-shape including two vertical lines regions of magnetization fixed regions, and a transverse line region of a magnetization free region crossing the two vertical line regions, and
wherein the two vertical line regions include regions, on one side of the transverse line region, connected respectively to the first and second input terminals, and regions, on a side opposite to the one side of the transverse line region, connected respectively to complementary first and second input terminals adapted to be supplied with signals complementary to signals supplied to the first and second input terminals, respectively.

2. The non-volatile logic operation device according to claim 1, wherein the operation layer includes a ferromagnetic material having perpendicular magnetic anisotropy.

3. The non-volatile logic operation device according to claim 1, wherein the control unit exerts a magnetic interaction on the operation unit.

4. The non-volatile logic operation device according to claim 3, wherein the magnetic interaction is a magnetostatic interaction.

5. The non-volatile logic operation device according to claim 1, wherein the operation layer includes:
a first magnetization fixed region; and a second magnetization fixed region, as one line of the vertical two lines regions;
a third magnetization fixed region and a fourth magnetization fixed region, as the other line of the two vertical lines regions; and
a magnetization free region, as the transverse line region, and
wherein the first magnetization fixed region is connected to the first input terminal, and the third magnetization fixed region is connected to the second input terminal.

6. The non-volatile logic operation device according to claim 5, wherein the second magnetization fixed region is connected to the first complementary input terminal, and the fourth magnetization fixed region is connected to the second complementary input terminal.

7. The non-volatile logic operation device according to claim 5, further comprising:
a fifth magnetization fixed layer arranged in a vicinity of the operation layer.

8. The non-volatile logic operation device according to claim 1, further comprising:
a third non-magnetic layer adjacent to the operation layer; and
a third magnetization fixed layer located adjacent to the third non-magnetic layer and opposite to the operation layer.

9. The non-volatile logic operation device according to claim 1, comprising:
- a second non-magnetic layer located adjacent to the control layer; and
- a second magnetization fixed layer located adjacent to the second non-magnetic layer and opposite to the control layer.

10. The non-volatile logic operation device according to claim 9, wherein the control layer includes:
- a ferromagnetic material having perpendicular magnetic anisotropy or in-plane magnetic anisotropy.

11. The non-volatile logic operation device according to claim 9, wherein the operation layer includes:
- a magnetization free region whose magnetization is reversible; and
- at least two magnetization fixed regions respectively arranged adjacent to the magnetization free region and mutually spaced from each other, as a planar shape, and having magnetizations thereof fixed in a same direction,
- the first input terminal and the second input terminal being respectively connected to the two magnetization fixed regions, and
- the third input terminal being connected to the second magnetization fixed layer of the control unit.

12. The non-volatile logic operation device according to claim 1, wherein, in the operation unit, each of the operation layer and the reference layer is formed of a ferromagnetic material having perpendicular magnetic anisotropy,
- wherein the operation layer includes a magnetization free region whose magnetization is reversible,
- the first non-magnetic layer is formed of a non-magnetic material and is provided adjacent to the magnetization free region of the operation layer,
- the reference layer has a fixed magnetization direction, and is provided adjacent to the first non-magnetic layer and opposite to the operation layer, and
- the operation layer, the first non-magnetic layer, and the reference layer form a laminated structure.

13. A non-volatile logic operation device comprising:
- first to third input terminals;
- an output terminal;
- an operation unit that is connected to the first input terminal, the second input terminal, and the output terminal, and that includes:
  - an operation layer;
  - a first non-magnetic layer; and
  - a reference layer, the operation unit performing a logic operation on signals applied at the first input terminal and the second input terminal to output from the output terminal a result of the logic operation; and
- a control unit that is connected to the third input terminal and that includes a control layer, the control unit being arranged in a vicinity of the operation unit,
- wherein the operation layer and the reference layer included in the operation unit are each formed of a ferromagnetic material having perpendicular magnetic anisotropy,
- wherein the operation layer includes a magnetization free region whose magnetization is reversible,
- the first non-magnetic layer is formed of a non-magnetic material and is provided adjacent to the magnetization free region of the operation layer,
- the reference layer has a fixed magnetization direction and is provided adjacent to the first non-magnetic layer and opposite to the operation layer, and
- the operation layer, the first non-magnetic layer, and the reference layer form a laminated structure,
- wherein the control unit includes:
  - the control layer;
  - a second non-magnetic layer; and
  - a second magnetization fixed layer,
- wherein the control layer and the second magnetization fixed layer are each formed of a ferromagnetic material having perpendicular magnetic anisotropy,
- the control layer is connected to an electrically conducting layer and is arranged spaced from and opposite to the magnetization free region of the operation layer with a predetermined space interposed between the control layer and the magnetization free region,
- the second non-magnetic layer is formed of a non-magnetic material, and is provided adjacent to the control layer and opposite to the electrically conducting layer,
- the second magnetization fixed layer is provided adjacent to the second non-magnetic layer and opposite to the control layer,
- the control layer, the second non-magnetic layer, and the second magnetization fixed layer form a laminated structure,
- wherein the operation layer includes at least two magnetization fixed regions respectively arranged adjacent to the magnetization free region and mutually spaced from each other, as a planar shape, and having magnetizations thereof fixed in a same direction,
- wherein the first input terminal and the second input terminal are respectively connected to the two magnetization fixed regions, and
- the third input terminal is connected to the second magnetization fixed layer of the control unit.

14. The non-volatile logic operation device according to claim 13, wherein the operation layer has, as a planar shape thereof, an H-type shape formed of two parallel vertical line regions and one transverse line region crossing the two vertical line regions,
- first and third regions of the two vertical line regions located on one side of the transverse line region are respectively made up of first and third magnetization fixed regions whose magnetizations are fixed,
- second and fourth regions of the two vertical line regions located on a side opposite to the one side of the transverse line region are respectively made up of second and fourth magnetization fixed regions whose magnetizations are fixed,
- the transverse line region is made up of the magnetization free region whose magnetization is reversible,
- the first input terminal and a complementary first input terminal that operates complementarily to the first input terminal are respectively connected to the first magnetization fixed region and the second magnetization fixed region,
- the second input terminal and a complementary second input terminal that operates complementarily to the second input terminal are respectively connected to the third magnetization fixed region and the fourth magnetization fixed region, and
- the third input terminal is connected to the second magnetization fixed layer, and a complementary third input terminal that operates complementarily to the third input terminal is connected to the electrically conducting layer.

15. The non-volatile logic operation device according to claim 14, wherein the first magnetization fixed region and the second magnetization fixed region have magnetizations fixed in mutually anti-parallel directions, the third magnetization fixed region and the fourth magnetization fixed region have magnetizations fixed in mutually anti-parallel directions, and the first magnetization fixed region and the third magnetization fixed region have magnetizations fixed in a same direction.

16. A non-volatile logic operation device comprising:
first to third input terminals;
an output terminal;
an operation unit that is connected to the first input terminal, the second input terminal, and the output terminal, and that includes:
   an operation layer;
   a first non-magnetic layer; and
   a reference layer, the operation unit performing a logic operation on signals applied at the first input terminal and the second input terminal to output from the output terminal a result of the logic operation; and
a control unit that is connected to the third input terminal and that includes a control layer, the control unit being arranged in a vicinity of the operation unit,
wherein the operation unit includes a laminated structure of the first non-magnetic layer and the reference layer on a magnetization free region of the operation layer whose magnetization is reversible,
wherein the operation layer and the reference layer are each formed of a ferromagnetic material having perpendicular magnetic anisotropy,
the first non-magnetic layer is formed of a non-magnetic material and is provided adjacent to the magnetization free region of the operation layer,
the reference layer has a fixed magnetization direction, and is provided adjacent to the first non-magnetic layer and opposite to the operation layer,
the operation layer has, as a planar shape thereof, an H-type shape formed of two parallel vertical line regions and one transverse line region crossing the two vertical line regions,
first and third regions of the two vertical line regions located on one side of the transverse line region are respectively made up of first and third magnetization fixed regions whose magnetizations are fixed,
second and fourth regions of the two vertical line regions located on a side opposite to the one side of the transverse line region are respectively made up of second and fourth magnetization fixed regions whose magnetizations are fixed,
the transverse line region is made up of the magnetization free region whose magnetization is reversible,
wherein the control unit comprises a laminated structure of the control layer, a second non-magnetic layer, and a second magnetization fixed layer,
wherein the control layer and the second magnetization fixed layer are each formed of a ferromagnetic material having perpendicular magnetic anisotropy,
the control layer is connected to an electrically conducting layer, and is arranged spaced from and opposite to the magnetization free region of the operation layer with a predetermined space interposed between the control layer and the magnetization free region,
the second non-magnetic layer is formed of a non-magnetic material, and is provided adjacent to the control layer and opposite to the electrically conducting layer,
the second magnetization fixed layer is provided adjacent to the second non-magnetic layer and opposite to the control layer, the first input terminal and a complementary first input terminal that operates complementarily to the first input terminal are respectively connected to the first magnetization fixed region and the second magnetization fixed region,
the second input terminal and a complementary second input terminal that operates complementarily to the second input terminal are respectively connected to the third magnetization fixed region and the fourth magnetization fixed region,
the third input terminal is connected to the second magnetization fixed layer, and the complementary third input terminal that operates complementarily to the third input terminal is connected to the electrically conducting layer,
the first magnetization fixed region and the second magnetization fixed region have magnetizations fixed in mutually anti-parallel directions,
the third magnetization fixed region and the fourth magnetization fixed region have magnetizations fixed in mutually anti-parallel directions, and
the first magnetization fixed region and the third magnetization fixed region have magnetizations fixed in a same direction.

17. The non-volatile logic operation device according to claim 16, wherein the operation layer, the first non-magnetic layer, and the reference layer form an MTJ (Magnetic Tunnel Junction) to exhibit a tunnel magneto-resistance effect.

18. A non-volatile logic operation device comprising:
first to third input terminals;
an output terminal;
an operation unit that is connected to the first input terminal, the second input terminal, and the output terminal, and that includes:
   an operation layer;
   a first non-magnetic layer; and
   a reference layer, the operation unit performing a logic operation on signals applied at the first input terminal and the second input terminal to output from the output terminal a result of the logic operation; and
a control unit that is connected to the third input terminal and that includes a control layer, the control unit being arranged in a vicinity of the operation unit,
wherein, in the operation unit, each of the operation layer and the reference layer is formed of a ferromagnetic material having perpendicular magnetic anisotropy,
wherein the operation layer includes a magnetization free region whose magnetization is reversible,
the first non-magnetic layer is formed of a non-magnetic material and is provided adjacent to the magnetization free region of the operation layer,
the reference layer has a fixed magnetization direction, and is provided adjacent to the first non-magnetic layer and opposite to the operation layer, and
the operation layer, the first non-magnetic layer, and the reference layer form a laminated structure,
wherein the control unit comprises:
   the control layer;
   a second non-magnetic layer; and
   a second magnetization fixed layer,
wherein the control layer and the second magnetization fixed layer in the control unit are each formed of a ferromagnetic magnetic material having in-plane magnetic anisotropy,
the control layer is connected to an electrically conducting layer, and is arranged spaced from and opposite to the magnetization free region of the operation layer with a predetermined space interposed between the control layer and the magnetization free region, the second non-magnetic layer is formed of a non-magnetic material and is provided adjacent to the control layer and opposite to the electrically conducting layer, the second magnetization fixed layer is provided adjacent to the second non-magnetic layer and opposite to the control layer, and the control layer, the second non-magnetic layer, and the second magnetization fixed layer form a laminated structure, and the center of the laminated structure is arranged shifted with respect to the laminated structure of the operation layer.

19. A non-volatile logic operation device comprising:

first to third input terminals;

an output terminal;

an operation unit that is connected to the first input terminal, the second input terminal, and the output terminal, and that includes:
  an operation layer;
  a first non-magnetic layer; and
  a reference layer, the operation unit performing a logic operation on signals applied at the first input terminal and the second input terminal to output from the output terminal a result of the logic operation; and a control unit that is connected to the third input terminal and that includes a control layer, the control unit being arranged in a vicinity of the operation unit, wherein, in the operation unit, each of the operation layer and the reference layer is formed of a ferromagnetic material having perpendicular magnetic anisotropy, wherein the operation layer includes a magnetization free region whose magnetization is reversible, the first non-magnetic layer is formed of a non-magnetic material and is provided adjacent to the magnetization free region of the operation layer, the reference layer has a fixed magnetization direction, and is provided adjacent to the first non-magnetic layer and opposite to the operation layer, and the operation layer, the first non-magnetic layer, and the reference layer form a laminated structure, wherein the operation layer has, as a planar shape thereof, an H-type shape including two parallel vertical line regions and one transverse line region crossing the two vertical line regions, wherein first and third regions of the two vertical line regions located on one side of the transverse line region are respectively made up of first and third magnetization fixed regions whose magnetizations are fixed, second and fourth regions of the two vertical line regions located on a side opposite to the one side of the transverse line region are respectively made up of second and fourth magnetization fixed regions whose magnetizations are fixed, the transverse line region is made up of the magnetization free region whose magnetization is reversible, and the transverse line region has a width reduced at a longitudinal central portion thereof.

20. A non-volatile logic operation device comprising:

first to third input terminals;

an output terminal;

an operation unit that is connected to the first input terminal, the second input terminal, and the output terminal, and that includes:
  an operation layer;
  a first non-magnetic layer; and
  a reference layer, the operation unit performing a logic operation on signals applied at the first input terminal and the second input terminal to output from the output terminal a result of the logic operation; and a control unit that is connected to the third input terminal and that includes a control layer, the control unit being arranged in a vicinity of the operation unit, wherein, in the operation unit, each of the operation layer and the reference layer is formed of a ferromagnetic material having perpendicular magnetic anisotropy, wherein the operation layer includes a magnetization free region whose magnetization is reversible, the first non-magnetic layer is formed of a non-magnetic material and is provided adjacent to the magnetization free region of the operation layer, the reference layer has a fixed magnetization direction, and is provided adjacent to the first non-magnetic layer and opposite to the operation layer, and the operation layer, the first non-magnetic layer, and the reference layer form a laminated structure, wherein the operation layer has a planar shape of an H-type shape including two parallel vertical line regions and one transverse line region crossing the two vertical line regions, wherein first and third regions of the two vertical line regions located on one side of the transverse line region are respectively made up of first and third magnetization fixed regions whose magnetizations are fixed, second and fourth regions of the two vertical line regions located on a side opposite to the one side of the transverse line region are respectively made up of second and fourth magnetization fixed regions whose magnetizations are fixed, the transverse line region is made up of the magnetization free region whose magnetization is reversible, and wherein a first end portion of the transverse line region extending to opposite sides of the first and second magnetization fixed regions which are opposite to sides respectively facing the third and fourth magnetization fixed regions, includes a concave portion, and a second end portion of the transverse line region extending to opposite sides of the third and fourth magnetization fixed regions which are opposite to sides respectively facing the first and second magnetization fixed regions, includes a concave portion.

* * * * *